United States Patent
Legendre et al.

(10) Patent No.: US 11,961,663 B2
(45) Date of Patent: Apr. 16, 2024

(54) SUPERCONDUCTING CURRENT LIMITING DIPOLE, COMPRISING AT LEAST FOUR SUPERCONDUCTING CABLES

(71) Applicants: Supergrid Institute, Villeurbanne (FR); Institut Polytechnique De Grenoble, Grenoble (FR)

(72) Inventors: Pierre Legendre, Lyons (FR); Pascal Tixador, Lyons (FR)

(73) Assignees: Supergrid Institute, Villeurbanne (FR); Institute Polytechnique De Grenoble, Grenoble (FR)

( * ) Notice: Subject to any disclaimer, the term of this patent is extended or adjusted under 35 U.S.C. 154(b) by 844 days.

(21) Appl. No.: 16/955,931

(22) PCT Filed: Dec. 12, 2018

(86) PCT No.: PCT/FR2018/053225
§ 371 (c)(1),
(2) Date: Jun. 19, 2020

(87) PCT Pub. No.: WO2019/122608
PCT Pub. Date: Jun. 27, 2019

(65) Prior Publication Data
US 2020/0343030 A1    Oct. 29, 2020

(30) Foreign Application Priority Data
Dec. 22, 2017   (FR) ........................... 1763092

(51) Int. Cl.
*H01F 6/06*    (2006.01)
*H01F 27/28*   (2006.01)
(Continued)

(52) U.S. Cl.
CPC ........... *H01F 6/06* (2013.01); *H01F 27/2823* (2013.01); *H01F 27/2871* (2013.01);
(Continued)

(58) Field of Classification Search
CPC ............................. H01F 6/06; H01F 27/2871
See application file for complete search history.

(56) References Cited

U.S. PATENT DOCUMENTS

| | | | |
|---|---|---|---|
| 2011/0116198 A1 | 5/2011 | Kraemer | |
| 2014/0251654 A1* | 9/2014 | Liu | H01B 7/02 174/25 R |

FOREIGN PATENT DOCUMENTS

| | | |
|---|---|---|
| CN | 1582485 A | 2/2005 |
| CN | 102376411 A | 3/2012 |

(Continued)

*Primary Examiner* — Paul A Wartalowicz
(74) *Attorney, Agent, or Firm* — GableGotwals

(57) ABSTRACT

A superconducting current limiting dipole (L6), comprising a superconducting conductor (F6) wound so as to form a two-wire coil extending in a single plane, a layer of insulator (E1 to E11, H1) being arranged between two turns of said coil. The superconducting conductor (C1 to C6) consists of at least four separate superconducting cables (C1 to C6) wound in parallel and arranged in at least two pairs, each of the pairs being formed by two of said superconducting cables (C1 to C6) that are electrically connected to one another in a first connection area, and, in a second connection area, one of the superconducting cables of one pair is electrically connected to one of the superconducting cables of the other pair, the other superconducting cable of each pair being connected to an electrical connection terminal (T1, T2) or to an additional pair.

38 Claims, 9 Drawing Sheets

(51) Int. Cl.
*H01F 27/32* (2006.01)
*H10N 60/30* (2023.01)
*H01F 6/00* (2006.01)

(52) U.S. Cl.
CPC ........... *H01F 27/323* (2013.01); *H10N 60/30* (2023.02); *H01F 2006/001* (2013.01)

(56) References Cited

FOREIGN PATENT DOCUMENTS

| CN | 103117145 A | 5/2013 |
| CN | 102592774 B | 2/2014 |
| CN | 203774773 U | 8/2014 |
| EP | 0503448 A2 | 3/1991 |
| EP | 0935261 A2 | 8/1999 |
| JP | H03226228 A | 10/1991 |

* cited by examiner

SUPERCONDUCTING CURRENT LIMITING DIPOLE, COMPRISING AT LEAST FOUR SUPERCONDUCTING CABLES

CROSS-REFERENCE TO RELATED APPLICATIONS

This application is the United States National Phase of PCT Patent Application No. PCT/FR2018/053225 filed on 12 Dec. 2018, which claims priority to French Patent Application No. 1763092 filed 22 Dec. 2017, both of which are incorporated herein by reference.

The invention relates to the field of superconducting current limiters intended for high-voltage applications.

These current limiters, which may be resistive, comprise a superconducting conductor and have very little resistance during normal operation. When an electrical fault results in a significant increase in the current density in the conductor, or when said conductor is no longer sufficiently cooled, the conductor loses its superconducting properties and the current limiter becomes highly resistive, thus keeping the current below a certain value.

The length of the superconducting conductor required for the current limiter is proportional to the voltage of the network or device to be protected. It reaches several hundred meters, or even kilometers, for a current limiter designed for high voltage. Current limiters are therefore preferably wound compactly in order to limit the size of such a device, which may nevertheless reach a diameter of several meters.

Documents EP0503448 and EP0935261 describe a current limiter comprising a superconducting conductor wound substantially in the form of a spiral in order to form a two-wire coil extending in a single plane.

The aim of the invention is to improve current limiters from the prior art by proposing an optimized arrangement for a superconducting conductor and for its connection terminals, and to do so for voltages of the order of 50 to 2000 kV and nominal currents of the order of 1000 A to 10000 A.

To this end, the invention targets a superconducting current limiting dipole, the two terminals of which are formed by a first electrical connection terminal and a second electrical connection terminal, this current limiting dipole comprising a superconducting conductor wound so as to form a two-wire coil extending in a single plane, a layer of insulator being arranged between two turns of said coil. Said superconducting conductor consists of at least four separate superconducting cables wound in parallel and arranged in at least two pairs, each of the pairs being formed of two of said superconducting cables, the superconducting cables being connected to one another so that the superconducting conductor extends in at least two outward and return paths between the periphery and the center of the coil while connecting the first electrical connection terminal to the second electrical connection terminal.

According to one preferred feature, each of the pairs is formed of a first and a second superconducting cable that are electrically connected to one another in a first connection area and, in a second connection area, the first superconducting cable of each pair is electrically connected to one of the superconducting cables of another pair, the second superconducting cable of each pair being connected to an electrical connection terminal or to one of the superconducting cables of another pair, one of the connection areas being the center of the coil and the other of the connection areas being the periphery of the coil.

The expression "connection area", throughout the description and the claims, denotes either the periphery of the coil or the center of the coil. The two possible connection areas are the periphery of the coil and the center of the coil. Thus, if one of the connection areas is the periphery of the coil, the other of the connection areas is the center of the coil. Conversely, if one of the connection areas is the center of the coil, the other of the connection areas is the periphery of the coil.

The voltage difference between two adjacent cables is thus able to be reduced.

The invention may also be improved by using an insulator that is different, in terms of its thickness or its features, between the various turns. In particular, it is thus beneficial to use an insulator of greater or lesser thickness depending on the voltage difference that will occur between two adjacent cables.

The current limiter is a dipole, that is to say that it comprises precisely and only two connection terminals. This current limiting dipole is intended to be inserted into an electrical circuit by virtue of its two poles, and its only function is in relation to the current flowing between these two poles: under certain circumstances, the current limiter limits the current flowing between these two poles, and under other circumstances the current limiter channels the current between the two poles without limitation. In all of its embodiments, the current limiting dipole thus comprises a first electrical connection terminal and a second electrical connection terminal. The current limiter comprises a superconducting conductor that extends in a spiral-shaped winding between these two electrical connection terminals. In other words, the superconducting conductor has two ends, one of these ends being connected to the first electrical connection terminal and the other of these ends being connected to the second electrical connection terminal.

Between the two electrical connection terminals, the superconducting conductor is wound in at least two outward and return paths between the periphery and the center of the coil. In the present description and the claims, the expression "the superconducting conductor extends in at least two outward and return paths between the periphery and the center of the coil" precisely denotes the path of the superconducting conductor between its two end points, i.e. the two electrical connection terminals. An outward and return path (of the superconducting conductor between the periphery and the center of the coil) precisely denotes the feature whereby:

with the current limiter forming a coil, the superconducting conductor is connected, by one of its ends, to the first electrical connection terminal that is located at the periphery of the coil, respectively at the center of this coil;

from the first connection terminal, the superconducting conductor extends by winding in the direction of the center of the coil, respectively in the direction of the periphery of the coil (this first portion of the superconducting conductor being denoted as "the outward path");

from the center of the coil, respectively from the periphery of the coil, the superconducting conductor extends by winding back toward the periphery of the coil, respectively toward the center of the coil (this second portion of the superconducting conductor being denoted as "the return path").

Thus, for example, a superconducting conductor that extends in two outward and return paths between the periphery and the center of the coil, and whose first electrical connection terminal is located at the periphery of the coil, will have the following path, from the first connection terminal to the second connection terminal:

from the first connection terminal located at the periphery of the coil, the superconducting conductor extends by winding toward the center of the coil;

from the center of the coil, the superconducting conductor continues its winding in an opposite path, toward the periphery of the coil;

from the periphery of the coil, the superconducting conductor extends by winding toward the center of the coil again;

from the center of the coil, the superconducting conductor continues its winding in an opposite path, toward the periphery of the coil.

Likewise, for example, a superconducting conductor that extends in two outward and return paths between the periphery and the center of the coil, and whose first electrical connection terminal is located at the center of the coil, will have the following arrangement:

from the first connection terminal located at the center of the coil, the superconducting conductor extends by winding toward the periphery of the coil;

from the periphery of the coil, the superconducting conductor continues its winding in an opposite path, toward the center of the coil;

from the center of the coil, the superconducting conductor extends by winding toward the periphery of the coil again;

from the periphery of the coil, the superconducting conductor continues its winding in an opposite path, toward the center of the coil.

In other words, the feature whereby "the superconducting conductor extends in at least two outward and return paths between the periphery and the center of the coil while connecting the first electrical connection terminal to the second electrical connection terminal" means that the path of the superconducting cable comprises at least:

a first portion extending from the periphery to the center of the coil, respectively from the center to the periphery of the coil;

a second portion, separate from the first portion, extending from the center to the periphery of the coil, respectively from the periphery to the center of the coil;

a third portion, separate from the first and second portions, extending from the periphery to the center of the coil, respectively from the center to the periphery of the coil;

a fourth portion, separate from the first, second and third portions, extending from the center to the periphery of the coil, respectively from the periphery to the center of the coil.

The path of the superconducting cable is defined as the arrangement of this cable in its route between the first electrical connection terminal and the second electrical connection terminal.

A winding with several outward and return paths specifically makes it possible to reduce the voltage between two cables, and therefore to limit the size of the insulators that are required. The current limiter according to the invention allows better voltage withstand, thereby making it possible to produce a current limiter that is more compact and/or permits a higher operating voltage. Voltage withstand denotes the ability of the current limiter to withstand a significant potential difference, in the light of the high voltages involved, within the elements of its structure, without an electrical discharge taking place between these elements, in other words while guaranteeing that the breakdown voltage of each element of the current limiter, in particular the spacers between each cable, is always greater than the maximum voltage that is able to occur across the terminals of this element when the current limiter becomes resistive in response to a circuit fault.

Specifically, the two-wire winding in the form of a spiral makes it possible to optimize space and to make the current limiter compact, but also inherently generates a difficulty linked to the fact that, in the event of a fault, when the conductor becomes resistive, a high voltage develops at its terminals and in its structure. The need for the superconducting conductor to be wound in the form of a two-wire coil accentuates the difficulty, because the conductor therefore has to travel the same route both in one direction of rotation and in the opposite direction of rotation, thereby limiting the possibilities for placing the components of the current limiter and the circuit for the passage of the superconducting conductor. A voltage difference proportional to the length of the conductor is therefore present between two adjacent cables.

A current limiter according to the invention makes it possible to implement a greater conductor length distributed in several sections of superconducting cable. The structure of the current limiter allows a better voltage withstand, thereby making it possible for use with higher voltages than previously. Specifically, the arrangement of the cables and the connection terminals guarantees optimized juxtaposition of the high-voltage elements, while at the same time keeping the assembly in a more compact size. Objectives that are a priori divergent (better voltage withstand and better compactness) are thus achieved by virtue of the invention.

The superconducting cable is a conductive wire that may have any cross section, for example round, oval or rectangular. It may consist of a core covered with a superconducting coating. It may advantageously consist in part of one of the following materials:

$REBa_2Cu_3O_{7+x}$, where RE represents one or more elements from among Y and rare earths (Gd, Nd, Dy Eu, etc.);

$MgB_2$;

$Bi_2Sr_2Ca_2Cu_3O_{10+x}$;

Any other superconducting material suitable for the manufacture of current limiting cables.

Allowing the superconducting conductor to take several outward and return paths between the periphery and the center of the coil gives rise to possibilities for the advantageous distribution of potentials. These possibilities may then be materialized by an appropriate distribution of the elements so as to connect the superconducting cables to one another.

The variable thickness from one layer of insulator to another contributes to the gain in compactness, while at the same time maintaining the necessary voltage withstand.

The current limiter may comprise the following additional features, on their own or in combination:

at least one of the superconducting cables is interposed between the two superconducting cables that are each connected to a connection terminal;

the two superconducting cables of one and the same pair are of the same length;

between the two superconducting cables connected to the connection terminals, the number of layers of insulator is equal to at least half the total number of superconducting cables;

the superconducting cables are connected to one another at the center of the coil, so as to form said pairs, by bridging loops;

said bridging loops are arranged side by side;

said bridging loops are distributed over the inner contour of the coil;

the superconducting conductor consists of 2N superconducting cables arranged in N pairs, N bridging loops in a first connection area of the coil and N−1 bridging loops in a second connection area of the coil, the first connection area and the second connection area of the coil being chosen from among the periphery and the center of the coil, N being greater than or equal to 2;

the superconducting conductor comprises N bridging loops at the periphery of the coil, respectively at the center of the coil, and N−1 bridging loops at the center of the coil, respectively at the periphery of the coil;

the superconducting conductor consists of 2N superconducting cables arranged in N pairs, N bridging loops at the center of the coil and N−1 bridging loops at the periphery of the coil;

the superconducting conductor consists of 2N superconducting cables arranged in N pairs, N−1 bridging loops at the center of the coil and N bridging loops at the periphery of the coil;

the superconducting conductor consists of four superconducting cables arranged in two pairs, two bridging loops at the center of the coil and one bridging loop at the periphery of the coil;

the two bridging loops at the center of the coil are adjacent, and the bridging loop at the periphery of the coil is located between the two connection terminals;

within the coil, between the superconducting cable connected to one connection terminal and the adjacent superconducting cable that is connected to the other connection terminal, the layer of insulator has a thickness greater than the other layers of insulator;

the two bridging loops at the center of the coil are adjacent, and the bridging loop at the periphery of the coil bypasses a connection terminal;

the two bridging loops at the center of the coil are concentric, and the bridging loop at the periphery of the coil bypasses a connection terminal;

the superconducting conductor consists of six superconducting cables arranged in three pairs, three bridging loops at the center of the coil and two bridging loops at the periphery of the coil;

the three bridging loops at the center of the coil are adjacent and the two bridging loops at the periphery of the coil each bypass a connection terminal;

two of the bridging loops at the center of the coil are concentric and one of the bridging loops at the periphery of the coil is arranged between the two connection terminals;

one of the bridging loops at the center of the coil diametrically passes through the center of the coil, the other two bridging loops at the center of the coil being located on either side of said coil, and one of the bridging loops at the periphery of the coil is arranged between the two connection terminals;

the superconducting conductor consists of eight superconducting cables arranged in four pairs, four bridging loops at the center of the coil and three bridging loops at the periphery of the coil;

the four bridging loops at the center of the coil are adjacent and one of the bridging loops at the periphery of the coil bypasses a connection terminal and another of the bridging loops, and the third bridging loop at the periphery of the coil is located between the two connection terminals;

two of the bridging loops at the center of the coil are adjacent, the other two bridging loops at the center of the coil being concentric, and two of the bridging loops at the periphery of the coil are located between the two connection terminals;

the four bridging loops at the center of the coil are adjacent and the three loops at the periphery of the coil are concentric and surround a connection terminal;

the superconducting cables form a bundle that is wound on itself, one of the layers of insulator forming a bundle layer of insulator arranged between two windings of the bundle, whereas the other layers of insulator form cable layers of insulator that are each arranged between two superconducting cables, the bundle layer of insulator being located between two superconducting cables that are each connected to a connection terminal;

the current limiter comprises at least two layers of insulator of different thicknesses;

the current limiter furthermore comprises at least two layers of insulator made of a different material;

the layer of insulator located between two superconducting cables whose potential difference is the lowest, when the current limiting dipole becomes resistive, has a thickness less than that of the other layers of insulator;

the layer of insulator located between two superconducting cables whose potential difference is the highest, when the current limiting dipole becomes resistive, has a thickness greater than that of the other layers of insulator;

the bundle layer of insulator has a thickness greater than the cable layers of insulator;

the bundle layer of insulator has a thickness greater than ⅔ of the sum of the thicknesses of the cable layers of insulator;

the bundle layer of insulator has a thickness greater than 1.5 times the thickness of a cable layer of insulator;

with the cables being in a number of 2n, the bundle layer of insulator has a thickness of the order of n times the thickness of a cable layer of insulator;

the first connection area is located at the center of the coil, and the second connection area is located at the periphery of the coil;

the first connection area is located at the periphery of the coil, and the second connection area is located at the center of the coil;

the current limiter comprises four superconducting cables arranged in two pairs, two bridging loops in a first connection area, a bridging loop in a second connection area, and two connection terminals, the first connection area and the second connection area of the coil being chosen from among the periphery and the center of the coil, the bundle layer of insulator being located between two superconducting cables that are each connected to a connection terminal;

the current limiter comprises six superconducting cables arranged in three pairs, three bridging loops in a first connection area, two bridging loops in a second connection area, and two connection terminals, the first connection area and the second connection area of the coil being chosen from among the periphery and the center of the coil, the bundle layer of insulator being located between two superconducting cables that are each connected to a connection terminal;

the current limiter comprises eight superconducting cables arranged in four pairs, four bridging loops in a first connection area, three bridging loops in a second connection area, and two connection terminals, the first connection area and the second connection area of the coil being chosen from among the periphery and the center of the coil, the bundle layer of insulator being located between two superconducting cables that are each connected to a connection terminal.

In the description and the claims, the expression "bridging loop" is defined as any means for connecting the ends of two superconducting cables.

One preferred exemplary embodiment of the invention will now be described with reference to the appended drawings, in which:

FIG. 1 schematically shows a current limiter according to the prior art;

Figure 1:
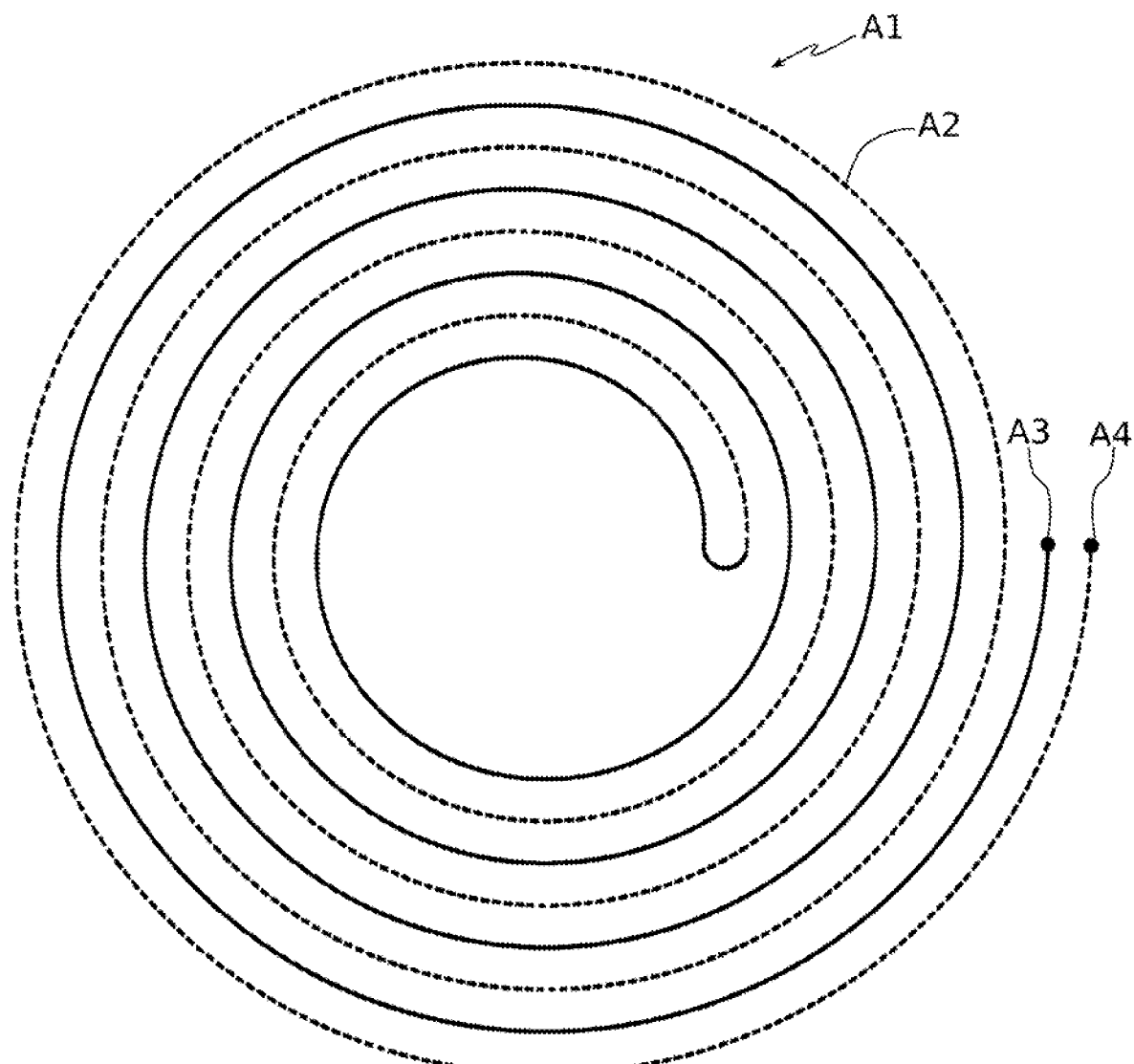

FIG. 1 shows a current limiter A1 according to the prior art. Such a current limiter consists of the winding of a superconducting conductor and of insulating layers, in the form of a spiral. The current limiter A1 according to the prior art comprises a single conductor A2 wound in the form of a two-wire coil, each end of the conductor A2 being connected to a connection terminal A3, A4.

FIGS. 2 to 16 schematically show a current limiter according to various embodiments and variants of the invention. FIGS. 2 to 16 schematically show the coil resulting from these windings, seen from above, so as to show the winding structures and the connections that characterize the invention. The superconducting conductor is wound so as to form a two-wire coil extending in a single plane (the plane of the drawings). The electrical connections are shown in simplified form, in the manner of a circuit diagram, it being understood that a person skilled in the art will know how to create these connections in a practical manner, in the light in particular of mechanical constraints, space constraints and cost constraints. In the embodiments of FIGS. 2 to 12:

the current limiter is a dipole;

the current limiter comprises a single superconducting conductor, each end of which is connected to a connection terminal;

the two connection terminals form the terminals of the current limiting dipole;

the superconducting conductor consists of at least two pairs of superconducting cables.

In the embodiments of FIGS. 13 to 16:

the current limiter comprises one or more superconducting conductors, each end of which is connected to a connection terminal;

the superconducting conductor consists of at least one pair of superconducting cables.

In order to facilitate reading, all of the figures comply with the following convention:

one of the superconducting cables of a pair is shown in unbroken lines, whereas the other of the superconducting cables of this same pair is shown in dotted lines, so as to clearly differentiate the "outward" cable (the current flows in one direction, for example from the periphery to the center) from the "return" cable (the current flows in the other direction, for example from the center to the periphery) of one and the same pair of superconducting cables;

the blank space between the superconducting cables consists of an insulator wound in parallel with the conductor such that all of the turns of the coil that are formed by the winding are kept isolated from one another by a layer of this insulator. The insulator is represented schematically by the blank space between the cables in order to simplify the figure. It is however an insulator in the form of sheets or strips, for example.

All of these figures show the connection terminals (terminals) of the limiter at the periphery of the coil. It is also possible to use geometries that are virtually identical to the connection terminals at the center of the coil. These diagrams are not shown, but are possible variants of the invention.

The current limiter is cooled, for example by a bath of liquid nitrogen, in order to be kept at the temperatures necessary to maintain the superconducting properties of the conductor. The insulator present between the turns of the conductor is therefore preferably porous, or provided with channels, in order to allow cooling through the passage of fluid or through a bath.

The length of the superconducting conductor, and therefore the number of turns of the winding, is also simplified in the drawings. By way of example, for a current limiter designed for 25 kV and whose superconducting conductor has a line resistance allowing a voltage drop of 50 V/m when it becomes resistive, this conductor will have to have a length of the order of 500 m, which leads to a two-wire coil with a diameter of several meters and a very large number of turns.

In order to facilitate the description, the same convention is used to denote the cables and the voltages that are present between these cables. According to this convention, if a current limiter comprises X cables:

the cables are numbered C1 to CX;

the voltage present, at the periphery of the winding, between the cables C1 and C2 is numbered U1, that present between the cables C2 and C3 is numbered U2, etc., and that present between the cables C(X−1) and CX is numbered U(X−1);

the voltage present, at the periphery of the winding, between the cables CX and C1 (after one turn of the winding) is numbered UX;

the voltage present, at the center of the winding, between the cables C1 and C2 is numbered V1, that present between the cables C2 and C3 is numbered V2, etc., and that present between the cables C(X−1) and CX is numbered V(X−1);

the voltage present, at the center of the winding, between the cables C1 and CX (after one turn of the winding) is numbered VX;

the insulating layer present between the cables C1 and C2 is numbered E1, that present between the cables C2 and C3 is numbered E2, etc., and that present between the cables C(X−1) and CX is numbered E(X−1);

the insulating layer present between the cables CX and C1 is numbered H1.

The voltages are represented by arrows in the drawings, but only the absolute value of these voltages is considered in the present text.

Figure 2:
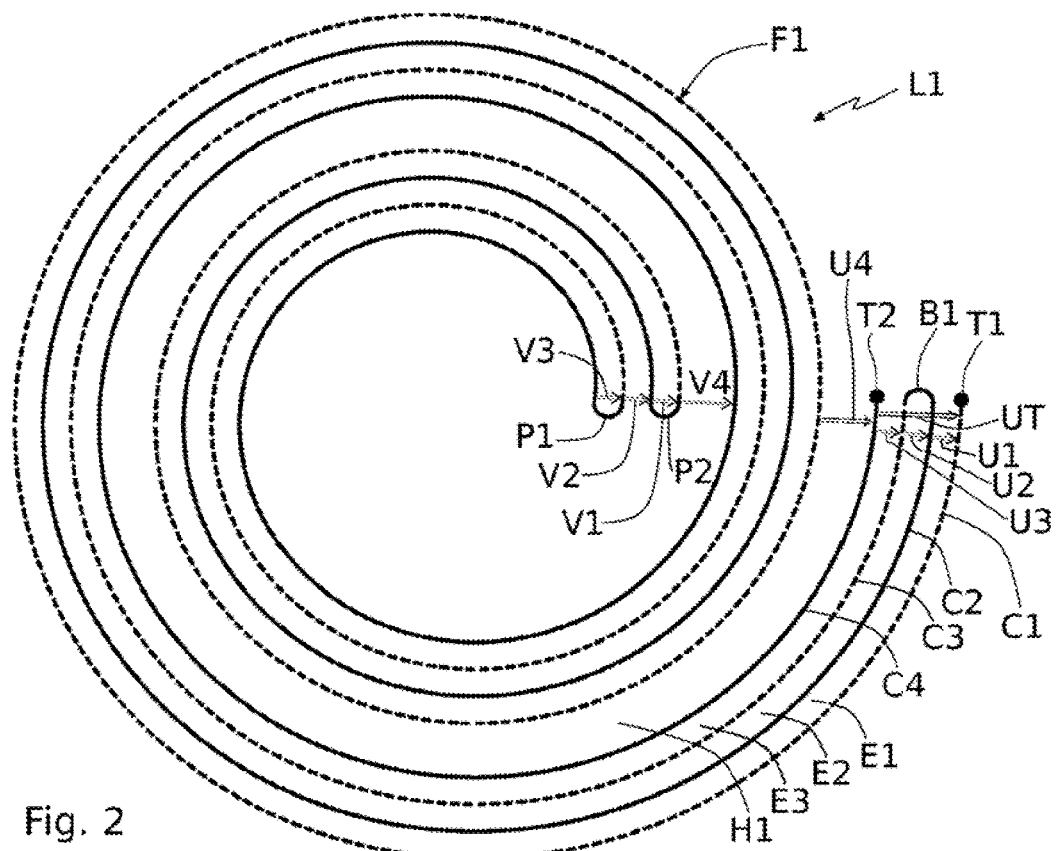
FIG. 2 is a schematic view of a current limiter according to a first embodiment of the invention.

FIG. 2 relates to a first embodiment of the invention targeting a current limiter L1 that comprises a superconducting conductor F1. The conductor F1 consists of four superconducting cables C1, C2, C3, C4 that are wound in parallel, substantially in the form of a spiral, with four layers of insulator E1, E2, E3, H1.

At the periphery of the spiral, the cable C1 is connected to a connection terminal T1 and the cable C4 is connected to a connection terminal T2. The connection terminals T1 and T2 are the two terminals by way of which the current limiter L1 is able to be connected to an electrical circuit in order to perform its function, i.e. that of limiting current, in this circuit. When the current limiter acts to limit the current, the conductor F1 becomes highly resistive and a voltage occurs across these two connection terminals T1, T2. This voltage is of a high voltage level in the present application.

As explained above, the current limiter in all of the embodiments is a dipole whose sole function is in relation to the current flowing, with or without limitation, between the two connection terminals T1 and T2.

The two connection terminals T1, T2 are placed in the same area of the periphery of the spiral but are arranged on either side of the thickness formed by the four superconducting cables C1, C2, C3, C4 and the three layers of insulator E1, E2, E3 situated between them. At the periphery of the spiral, the superconducting cables C2 and C3, at the center of this thickness, are electrically connected to one another by a bridging loop B1.

The cable C4, which is connected to the connection terminal T2, and the cable C3, which is connected to the bridging loop B1, are moreover electrically connected to one another at the center of the spiral, by virtue of a bridging loop P1, and thus form a first pair of superconducting cables. Likewise, the cable C1, which is connected to the connection terminal T1, and the cable C2, which is connected to the bridging loop B1, are moreover electrically connected to one another at the center of the spiral, by virtue of a bridging loop P2, and thus form a second pair of superconducting cables. The bridging loops P1, P2 are in this case adjacent and are arranged side by side.

The conductor F1, by virtue of the two pairs C1, C2 and C3, C4 of superconducting cables, thus takes two outward and return paths between the periphery and the center of the spiral.

As explained above in the definition of the concept of "outward and return path", the outward and return paths of the conductor F1 between the periphery and the center of the coil in the form of a spiral consist here of:

a first "outward path" taken by the cable C1 between the terminal T1 and the center of the coil;

a first "return path" taken by the cable C2 between the center of the coil and the periphery of the coil;

a second "outward path" taken by the cable C3 between the periphery of the coil and the center of the coil;

a second "return path" taken by the cable C4 between the center of the coil and the terminal T2 located at the periphery of the coil.

This concept of outward and return paths of a conductor F taken by cables C works in the same way for all of the embodiments that are described.

The superconducting cables C1 to C4 form a bundle that is wound on itself, one of the layers of insulator H1 forming a bundle layer of insulator arranged between two windings of the bundle, whereas the other layers of insulator E1 to E3 form cable layers of insulator each arranged between two superconducting cables.

A voltage develops across the terminals of the current limiter L1 and in its structure, when it becomes resistive as a result of losing the superconducting features of the cables C1, C2, C3, C4 in response to an increase in current due for example to a fault with the circuit. The voltage present in this case between the connection terminals T1, T2 is denoted UT in FIG. 2. The distance between the connection terminals T1, T2 depends on the thicknesses of the superconducting cables and the layers of insulator.

In addition, each layer of insulator has to provide the voltage withstand for the voltage that occurs between the two cables that it separates. The highest voltage that develops within the current limiter L1, between two given cables, therefore determines the maximum thickness necessary for the layers of insulator E1, E2, E3, H1. These layer of insulator thicknesses are in this case optimized in conjunction with the positioning of the cables in order to achieve a gain in terms of winding thickness and/or better voltage withstand of the assembly.

Each of the insulator E1, E2, and E3 thicknesses respectively has to withstand a voltage U1, U2, U3 at the periphery of the coil and a voltage V1, V2, V3 at the center of the coil. In this example, U1 is greater than V1 and U3 is greater than V3, whereas V2 is greater than U2. These voltages correspond at most to UT/2 insofar as the conductor F1 takes two outward and return paths between the periphery and the center of the coil while passing through the four cables C1, C2, C3, C4. Specifically, the average voltage between the cable C1 and the cable C2 will be UT/4, but this voltage between C1 and C2 will in reality be variable and will have a value of at least 0 (V1) and at most 2×UT/4 (U1).

Specifically, if it is considered that the terminal T2 is at the potential UT, and that the current limiter L1, when it becomes resistive, returns the terminal T1 to zero potential, then each cable C1 to C4 provides a voltage drop of UT/4. In this case:

the terminal T2 is therefore at the potential UT;

the bridging loop P1 is at the potential 3·UT/4 (that is to say UT−¼ UT), since the cable C4 has been traversed between the terminal T2 and the bridging loop P1;

the bridging loop B1 is at the potential UT/2 (that is to say UT−²⁄₄ UT), since the cable C4 and the cable C3 have been traversed between the terminal T2 and the bridging loop B1;

the bridging loop P2 is at the potential UT/4 (that is to say UT−¾ UT), since the cable C4, the cable C3 and the cable C2 have been traversed between the terminal T2 and the bridging loop P2;

the terminal T1 is therefore at zero potential.

The maximum voltage that therefore has to be withstood by the insulating layer H1 is therefore the voltage U4 that occurs between the terminal T2 (at the potential UT) and the cable C1 (connected by one turn of the spiral to the terminal T1). Each of the other layers of insulator E1 to E3 will for their part have to withstand a maximum voltage equivalent to 2×UT/4=UT/2.

The highest voltage that develops within the current limiter L1, when it is resistive, is therefore the voltage U4. Since the cable C1 is connected to the terminal T1, the voltage U4 is equal to the voltage UT minus the voltage drop caused by one turn of the spiral of the cable C1. The voltage U4 is lower than UT by a few tens or hundreds of volts, for example (if consideration is given to a few meters of cable C1 causing a voltage drop of 50 to 100 V/m). It may be considered to be virtually equal to UT.

In order to withstand the voltage of U4, the layer of insulator H1 that is arranged between the cable C4 and the cable C1 has a thickness greater than that of the layers of insulator E1, E2 and E3, and/or possibly a different material or a different structure.

In the present example, the layer of insulator H1 has a thickness equal to twice the thickness of a layer of insulator E1, E2, or E3. More generally, the layer of insulator H1 preferably has a thickness of the order of N times the thickness of a layer of insulator E1, E2, or E3, N being the number of outward and return paths.

Figure 2B:
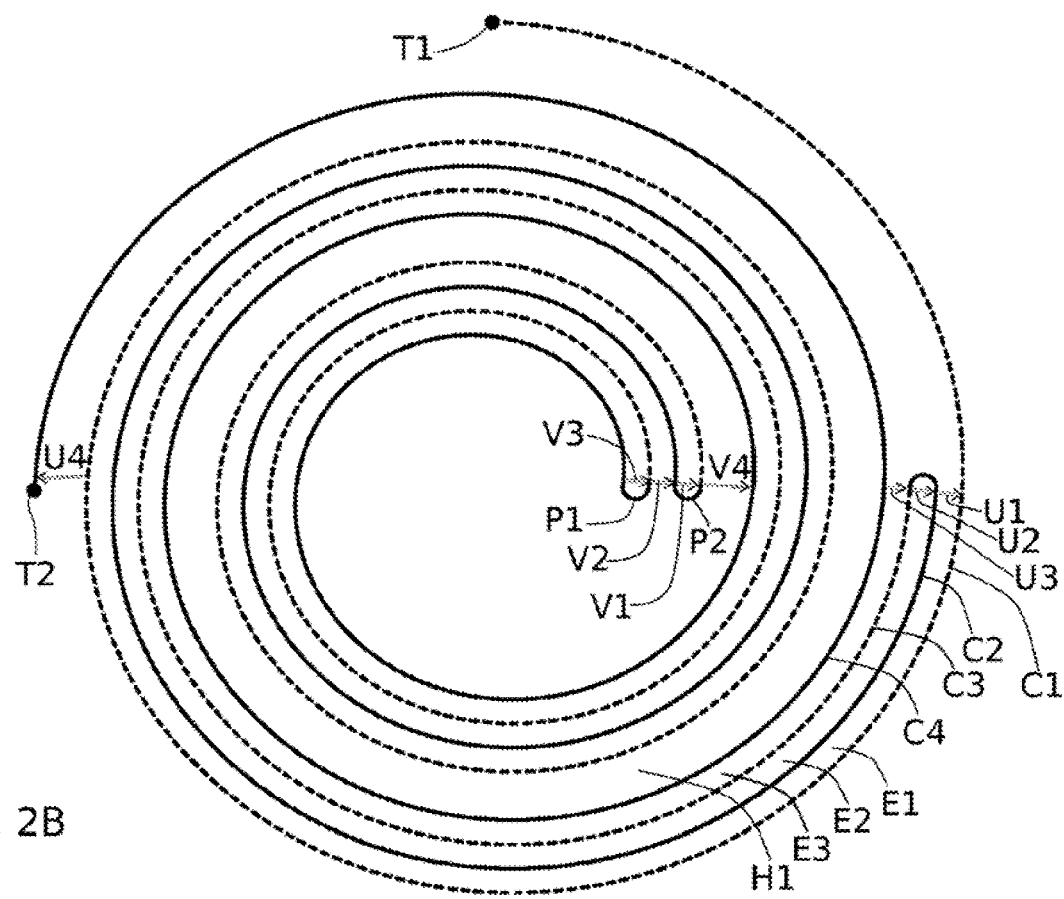
FIG. 2B is a schematic view of a current limiter according to a variant of the embodiment of FIG. 2.

FIG. 2B shows the same embodiment of the invention as FIG. 2, with a simple extension of the cables at the terminals T1 and T2, such that the terminals and the bridging loops are not aligned.

This variant changes the distribution of the potentials only very slightly. It is applicable to all of the other embodiments that will be described later on.

Figure 3:
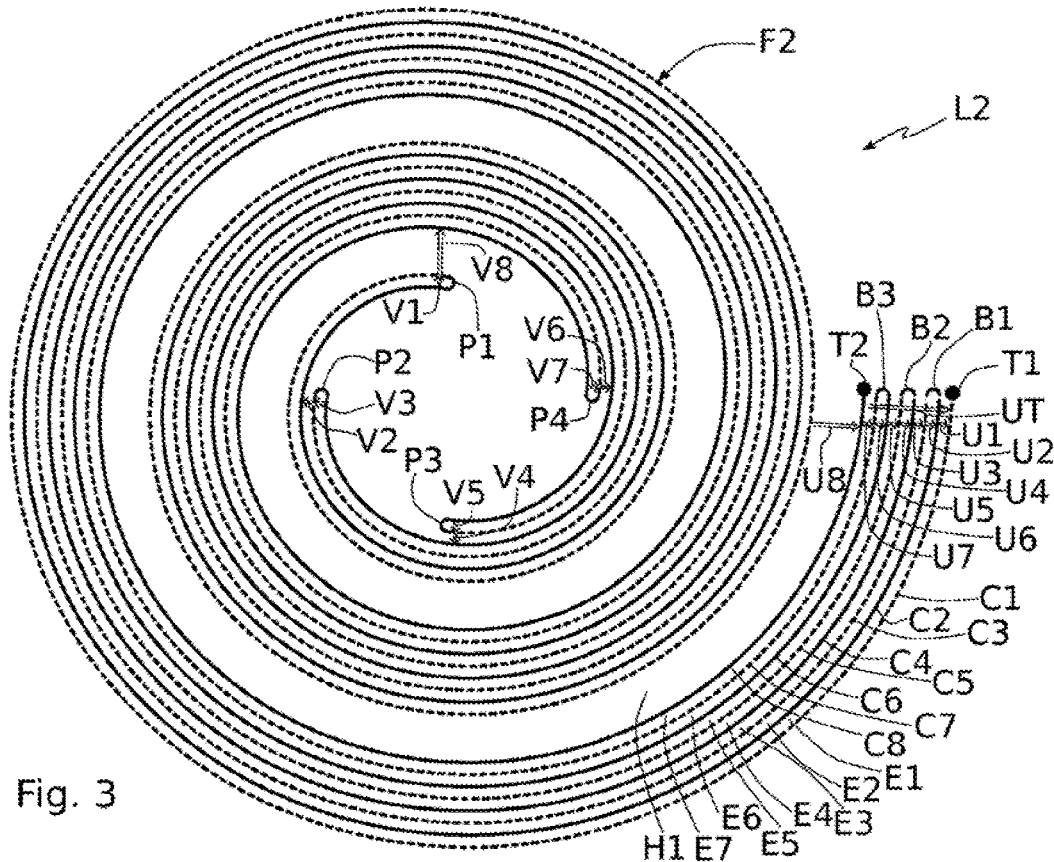
FIG. 3 is a schematic view of a current limiter according to a second embodiment of the invention.

FIG. 3 shows a second embodiment of the invention in which a current limiter L2 comprises a superconducting conductor F2, which consists in this case of eight superconducting cables C1 to C8 wound in parallel, substantially in the form of a spiral, with eight layers of insulator E1 to E7 and H1.

At the periphery of the spiral, the cable C1 is connected to a connection terminal T1 and the cable C8 is connected to a connection terminal T2 in order to connect the current limiter L2 to the electrical circuit to be protected.

The two connection terminals T1, T2 are placed in the same area of the periphery of the spiral but are arranged on either side of the thickness formed by the eight superconducting cables C1 to C8 and the seven layers of insulator E1 and E7 situated between them. Between the terminals T1, T2, the superconducting cables C2 to C7, at the center of this thickness, are electrically connected to one another in pairs by bridging loops. The cables C2 and C3 are connected by a bridging loop B1, the cables C4 and C5 are connected by a bridging loop B2, and the cables C6 and C7 are connected by a bridging loop B3.

The cable C1, which is connected to the connection terminal T1, and the cable C2, which is connected to the bridging loop B1, are moreover electrically connected to one another at the center of the spiral, by virtue of a bridging loop P1, and thus form a first pair of superconducting cables.

The cable C3, which is connected to the bridging loop B1, and the cable C4, which is connected to the bridging loop B2, are moreover electrically connected to one another at the center of the spiral, by virtue of a bridging loop P2, and thus form a second pair of superconducting cables.

The cable C5, which is connected to the bridging loop B2, and the cable C6, which is connected to the bridging loop B3, are moreover electrically connected to one another at the center of the spiral, by virtue of a bridging loop P3, and thus form a third pair of superconducting cables.

The cable C7, which is connected to the bridging loop B3, and the cable C8, which is connected to the connection terminal T2, are moreover electrically connected to one another at the center of the spiral, by virtue of a bridging loop P4, and thus form a fourth pair of superconducting cables.

The bridging loops P1, P2, P3, P4 are in this case adjacent but are not arranged side by side, and they are distributed regularly over the inner contour of the coil.

The conductor F2, by virtue of the four pairs of superconducting cables C1 to C8, thus covers four outward and return paths between the periphery and the center of the spiral.

At the center of the spiral, the bridging loops P1 to P4 are regularly angularly distributed in a circle, so as to afford each of them more assembly space. As a variant, these bridging loops P1 to P4 may be arranged side by side, like those in the first embodiment, or distributed over a portion of the central circle. The assembly in a circle may simplify manufacturing of the current limiter. One central component in the form of an insulating disk with four sockets for connecting the cables is sufficient.

The superconducting cables C1 to C8 form a bundle that is wound on itself, one of the layers of insulator H1 forming a bundle layer of insulator arranged between two windings of the bundle, whereas the other layers of insulator E1 to E7 form cable layers of insulator each arranged between two superconducting cables.

In this second embodiment, the voltage that develops across the terminals of the current limiter L2, when it becomes resistive, is also denoted UT in FIG. 3.

Each of the insulator E1 to E7 thicknesses has to withstand a voltage corresponding at most to UT/4 insofar as the conductor F2 takes four outward and return paths between the periphery and the center of the coil while traversing the eight cables C1 to C8.

Specifically, if it is considered that the terminal T2 is at the potential UT, and that the current limiter L2, when it becomes resistive, returns the terminal T1 to zero potential, then each cable C1 to C8 provides a voltage drop of UT/8. In this case:

the terminal T2 is therefore at the potential UT;

the bridging loop P4 is at the potential 7·UT/8 (that is to say UT−⅛ UT), since only the cable C8 has been traversed between the terminal T2 and the bridging loop P4;

the bridging loop B3 is at the potential 3·UT/4 (that is to say UT−⅖ UT), since the cable C8 and the cable C7 have been traversed between the terminal T2 and the bridging loop B3;

the bridging loop P3 is at the potential 5·UT/8 (that is to say UT−⅜ UT), since the cable C8, the cable C7 and the cable C6 have been traversed between the terminal T2 and the bridging loop P3;

the bridging loop B2 is at the potential UT/2 (that is to say UT−⅘ UT), since the cables C8, C7, C6 and C5 have been traversed between the terminal T2 and the bridging loop B2;

the bridging loop P2 is at the potential 3·UT/8 (that is to say UT−⅝ UT), since the cables C8, C0 C6, C5 and C4 have been traversed between the terminal T2 and the bridging loop P2;

the bridging loop B1 is at potential UT/4 (that is to say UT−⅜ UT), since the cables C8, C7, C6, C5, C4 and C3 have been traversed between the terminal T2 and the bridging loop B1;

the bridging loop P1 is at the potential UT/8 (that is to say UT−⅞ UT), since the cables C8, C7, C6, C5, C4, C3 and C2 have been traversed between the terminal T2 and the bridging loop P1;

the terminal T1 is therefore at zero potential.

The maximum voltage that has to be withstood by the insulating layer H1 is therefore the voltage U8 that occurs between the terminal T2 (at the potential UT) and the cable C1 (connected by one turn of the spiral to the terminal T1). Each of the other layers of insulator E1 to E7 for their part has to withstand a maximum voltage equivalent to 2×UT/8=UT/4.

The highest voltage that develops within the current limiter L2 is therefore the voltage U8 that is created between the connection terminal T2 and the cable C1 after the latter has made one turn of a spiral from the terminal T1. U8 is equal to the voltage UT minus the voltage drop caused by one turn of the spiral of the cable C1.

In order to withstand the voltage of U8, the layer of insulator H1 that is arranged between the cable C8 and the cable C1 has a thickness greater than that of the layers of insulator E1 to E7.

In the present example, the layer of insulator H1 has a thickness approximately equal to 4 times the thickness of one of the layers of insulator E1 to E7. More generally in this embodiment, the layer of insulator H1 preferably has a thickness of the order of N times the thickness of a layer of insulator E1 to E7. N being the number of outward and return paths.

Figure 4:
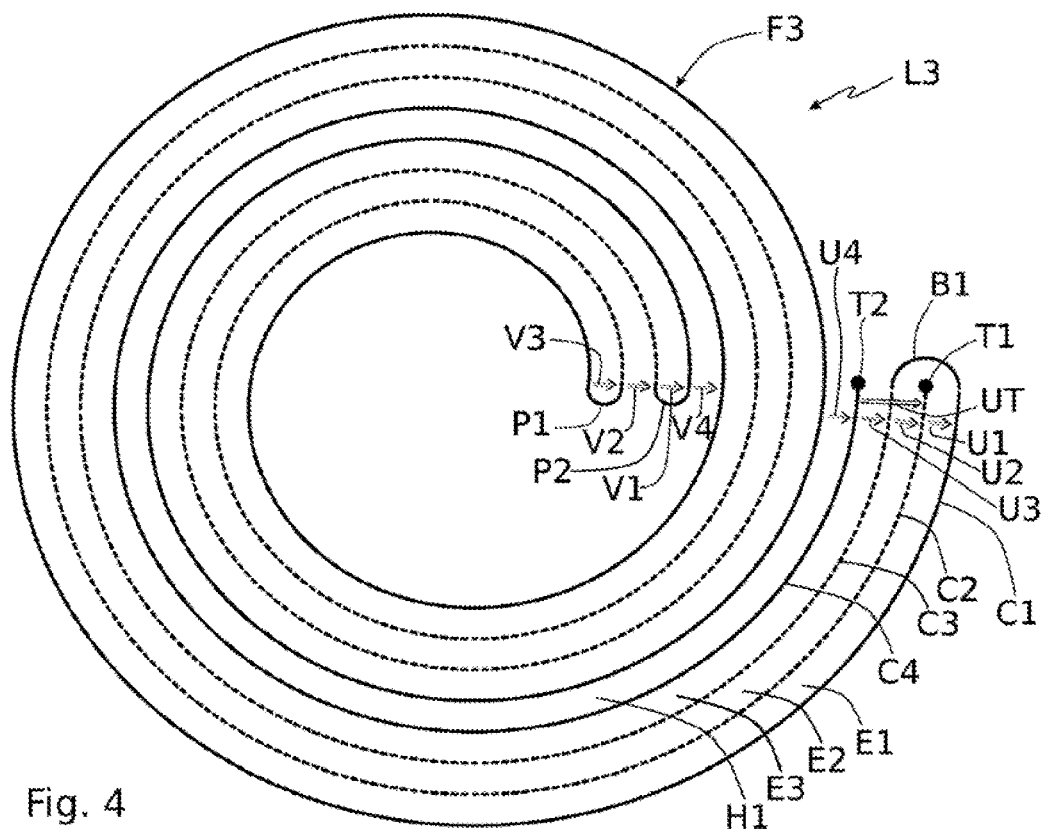
FIG. 4 is a schematic view of a current limiter according to a third embodiment of the invention.

FIG. 4 relates to a third embodiment according to which the current limiter L3 comprises a superconducting conductor F3 formed, as in the first embodiment, of four superconducting cables C1, C2, C3, C4 that are wound in parallel, substantially in the form of a spiral, with four layers of insulator E1, E2, E3, H1.

At the periphery of the spiral, the cable C2 is connected to a connection terminal T1 and the cable C4 is connected to a connection terminal T2.

The two connection terminals T1, T2 are placed in the same area of the periphery of the spiral, but are arranged on either side of the cable C3 and of the two layers of insulator E2, E3 surrounding said cable.

According to this third embodiment:

on either side of the terminal T1, the superconducting cables C1 and C3 are electrically connected by a bridging loop B1;

the cable C4, which is connected to the connection terminal T2, and the cable C3, which is connected to the bridging loop B1, are moreover electrically connected to one another at the center of the spiral, by virtue of a bridging loop P1, and thus form a first pair of superconducting cables;

the cable C2, which is connected to the connection terminal T1, and the cable C1, which is connected to the bridging loop B1, are moreover electrically connected to one another at the center of the spiral, by virtue of a bridging loop P2, and thus form a second pair of superconducting cables.

The bridging loops P1, P2 are in this case adjacent and are arranged side by side. They may also be arranged in a circle, in a manner similar to FIG. 3.

The conductor F3, by virtue of the two pairs C1, C2 and C3, C4 of superconducting cables, thus takes two outward and return paths between the periphery and the center of the spiral. However, the route taken for these outward and return paths is different from that of the first embodiment due to the different positioning of the bridging loops P1, P2, B1.

In this third embodiment, the voltage that develops across the terminals of the current limiter L3, when it becomes resistive, is also denoted UT in FIG. 4.

Each of the thicknesses of insulator E1, E2 and E3 respectively has to withstand a voltage U1, U2, U3 at the periphery of the coil and V1, V2, V3 at the center of the coil. Among these voltages, the maximum voltage is UT/2.

The distribution of the potentials, with each cable C1 to C4 providing a voltage drop of UT/4, is as follows:

the terminal T2 is therefore at the potential UT;

the bridging loop P1 is at the potential 3·UT/4 (that is to say UT−¼ UT), since the cable C4 has been traversed between the terminal T2 and the bridging loop P1;

the bridging loop B1 is at the potential UT/2 (that is to say UT−2/4 UT), since the cable C4 and the cable C3 have been traversed between the terminal T2 and the bridging loop B1;

the bridging loop P2 is at the potential UT/4 (that is to say UT−¾ UT), since the cable C4, the cable C3 and the cable C1 have been traversed between the terminal T2 and the bridging loop P2;

the terminal T1 is therefore at zero potential.

U4 has a value of UT/2 plus the value of the voltage drop caused by a turn of the spiral, whereas, from among U1, U2, U3, V1, V2, V3, the maximum value is UT/2. The maximum voltage that therefore has to be withstood by the layer of insulator H1 is therefore the voltage U4. Each of the other layers of insulator E1 to E3 has to withstand a voltage equal to UT/2, whereas the layer H1 has to withstand a slightly higher voltage.

In the present example, the layers of insulator E1 to E3 and H1 are of equal thickness, all being aligned with the thickness of H1.

As a variant, the layer of insulator H1 may have, as in the first embodiment, a thickness different from those of the layers of insulator E1 to E3. In this case, it would have a greater thickness since the voltage that it has to withstand is greater than the value corresponding to the voltage drop linked to a turn of the spiral, which may be a high value in the case of spirals with a large diameter and a low number of turns.

Figure 5:
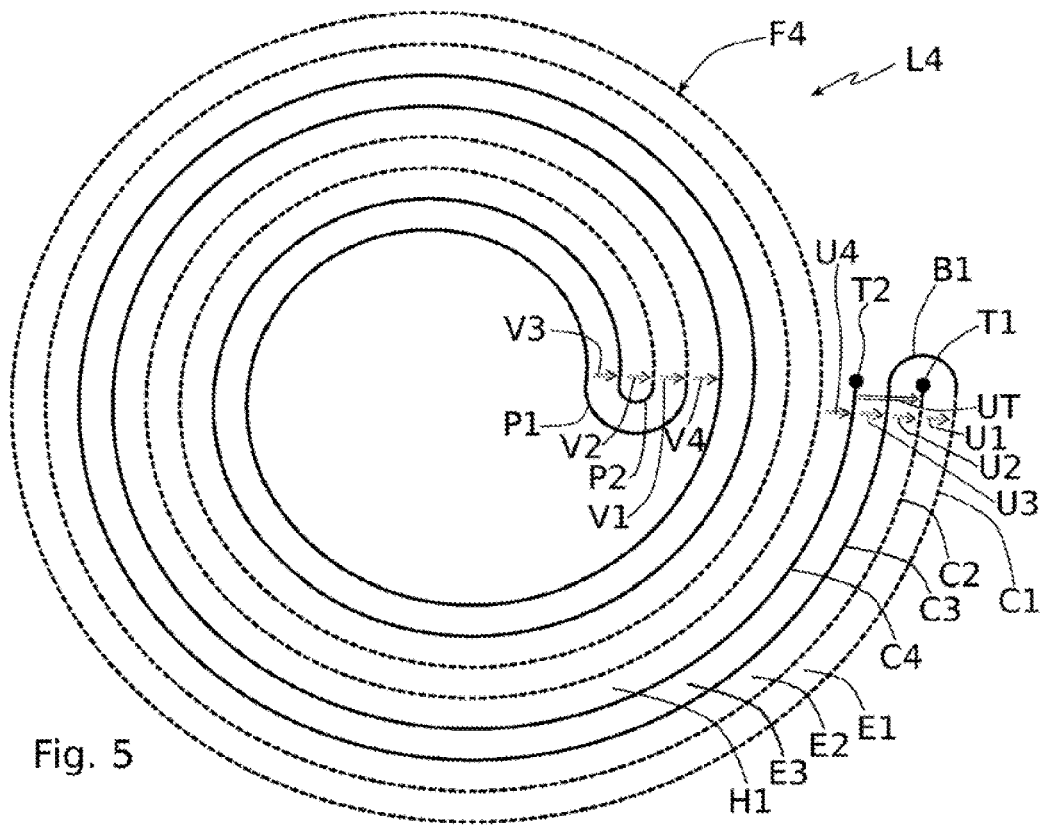
FIG. 5 is a schematic view of a current limiter according to a fourth embodiment of the invention.

FIG. 5 shows a fourth embodiment of the invention, which is a variant of the third embodiment. This variant targets a current limiter L4 provided with a superconducting cable F4, with a different arrangement of the bridging loops P1, P2.

According to this fourth embodiment:

on either side of the terminal T1, the superconducting cables C1 and C3 are electrically connected by a bridging loop B1;

the cable C4, which is connected to the connection terminal T2, and the cable C1, which is connected to the bridging loop B1, are moreover electrically connected to one another at the center of the spiral, by virtue of a bridging loop P1, and thus form a first pair of superconducting cables;

the cable C2, which is connected to the connection terminal T1, and the cable C3, which is connected to the bridging loop B1, are moreover electrically connected to one another at the center of the spiral, by virtue of a bridging loop P2, and thus form a second pair of superconducting cables.

Unlike the third embodiment, the bridging loops P1, P2 are not adjacent. They are concentric here. The bridging loops P1 and P2, which are thus concentric, give different connection possibilities at the center of the spiral, for example using one and the same curved piece, with two parallel tracks.

Just as in the third embodiment, the distribution of the voltages specific to this fourth embodiment is as follows:
  the terminal T2 is therefore at the potential UT;
  the bridging loop P1 is at the potential 3·UT/4;
  the bridging loop B1 is at the potential UT/2;
  the bridging loop P2 is at the potential UT/4;
  the terminal T1 is therefore at zero potential.

The maximum voltage that therefore has to be withstood by one of the insulating layers E1, E2, E3 or H1 is therefore also the voltage U4. Each of the layers of insulator E1 to E3 has to withstand at most a voltage equal to UT/2, whereas the layer H1 has to withstand a higher voltage. This also makes it possible to have layers of insulator E1 to E3 and H1 of equal thickness, aligned with that of H1.

As a variant, the layer of insulator H1 may also have, as in the first embodiment, a thickness different from that of the layers of insulator E1 to E3, in particular a greater thickness.

Figure 6:
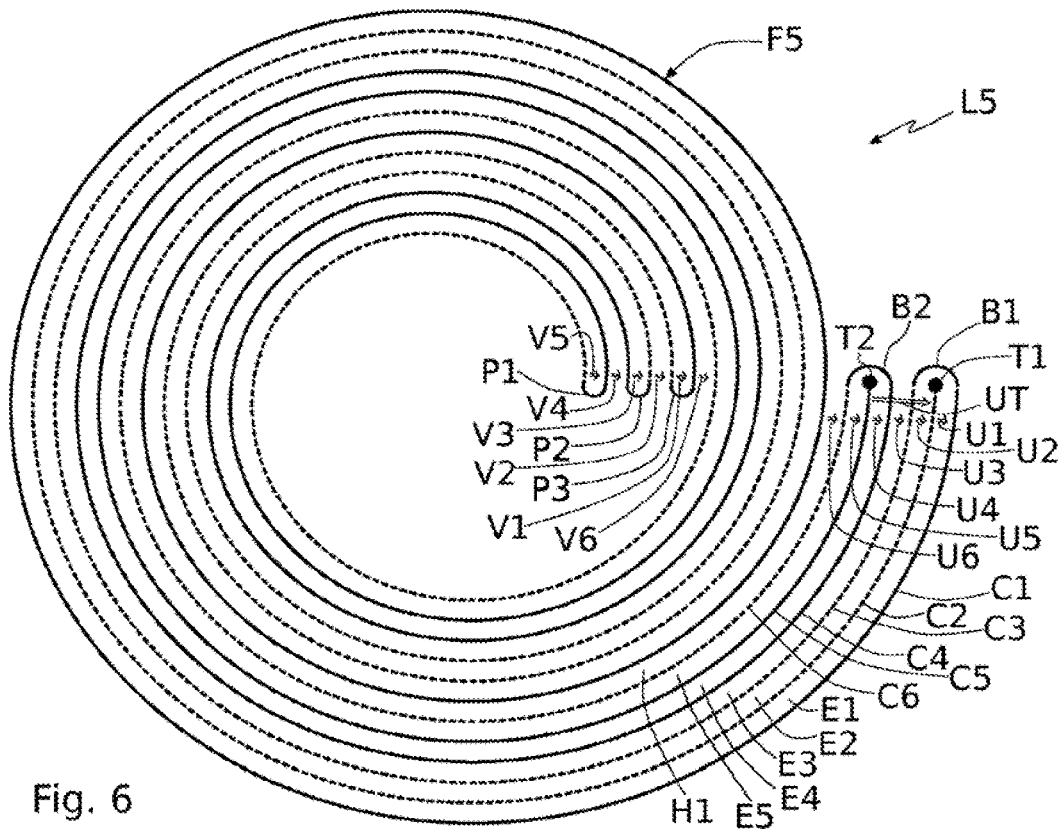
FIG. 6 is a schematic view of a current limiter according to a fifth embodiment of the invention.
Figure 7:
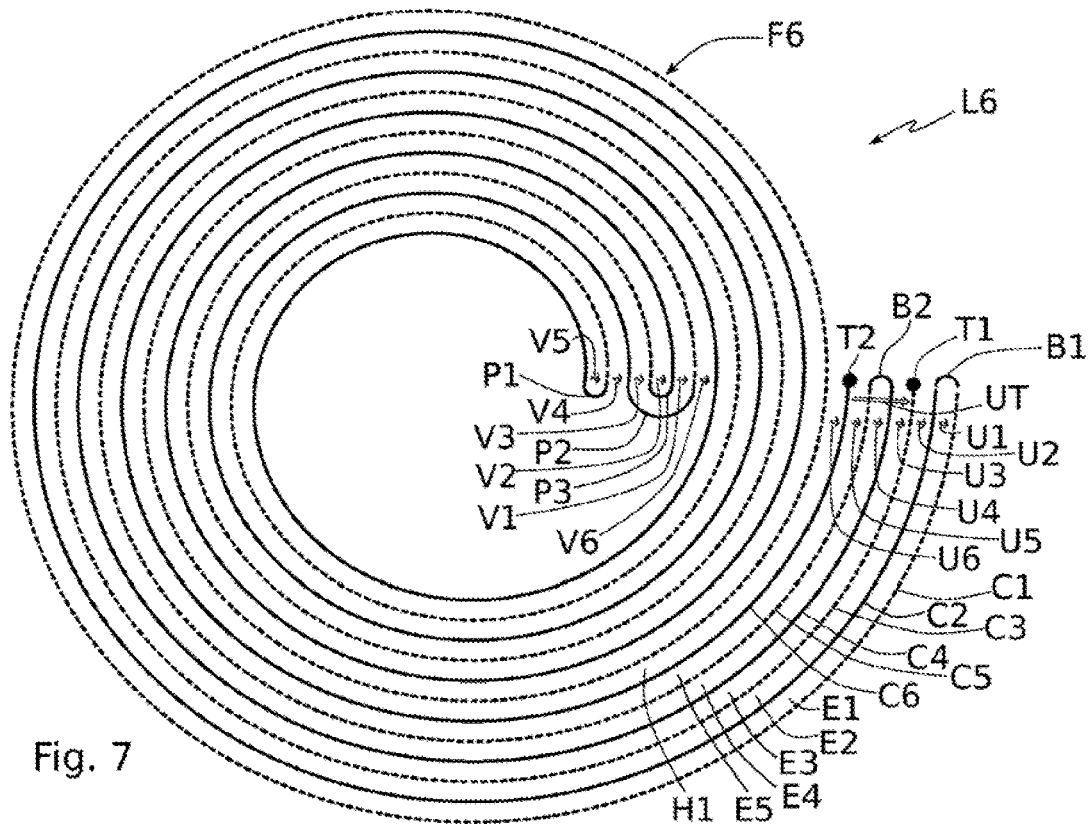
FIG. 7 is a schematic view of a current limiter according to a sixth embodiment of the invention.
Figure 8:
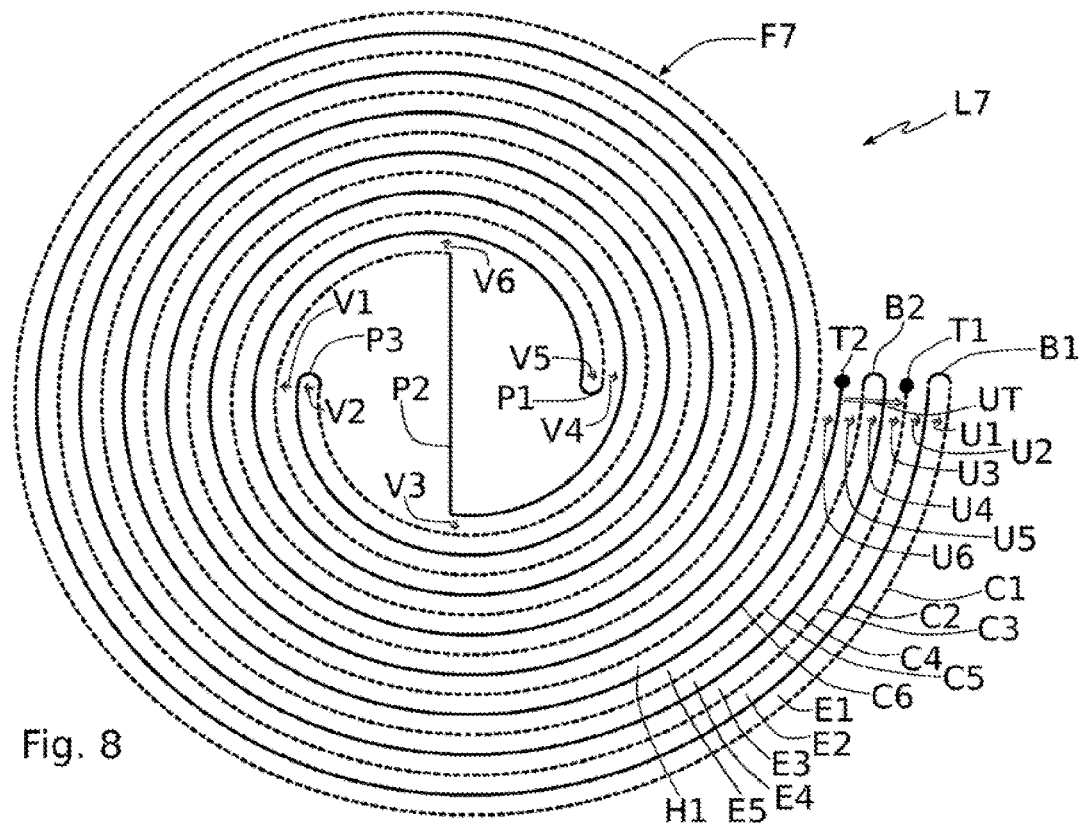
FIG. 8 is a schematic view of a current limiter according to a seventh embodiment of the invention.

FIGS. 6 to 8 target embodiments in which the current limiter comprises 6 superconducting cables distributed in three pairs.

FIG. 6 shows a fifth embodiment of the invention in which a current limiter L5 comprises a superconducting conductor F5, which consists in this case of 8 superconducting cables C1 to C6 that are wound with six layers of insulator E1 to E5 and H1.

The cables C2 and C5 are connected respectively, at the periphery of the spiral, to the connection terminals T1 and T2.

The two connection terminals T1, T2 are arranged in this case on either side of the cables C3 and C4 with their three relative layers of insulator E2, E3, E4.

At the periphery of the spiral, the bridging loop B1 connects the cable C1 and the cable C3, and the bridging loop B2 connects the cable C4 and the cable C6.

At the center of the spiral:
  the cables C5 and C6 are connected by a bridging loop P1, forming a first pair of superconducting cables;
  the cables C3 and C4 are connected by a bridging loop P2, forming a second pair of superconducting cables;
  the cables C1 and C2 are connected by a bridging loop P3, forming a third pair of superconducting cables.

The bridging loops P1, P2, P3 are in this case adjacent and are arranged side by side.

The conductor F5, by virtue of the three pairs of superconducting cables C1 to C6, thus covers three outward and return paths between the periphery and the center of the spiral.

According to this fifth embodiment, if it is considered that the terminal T2 is at the potential UT, and that the current limiter L5, when it becomes resistive, returns the terminal T1 to zero potential, then each cable C1 to C6 provides a voltage drop of UT/6. In this case:
  the terminal T2 is therefore at the potential UT;
  the bridging loop P1 is at the potential 5·UT/6 (that is to say UT−⅙ UT);
  the bridging loop B2 is at the potential 2·UT/3 (that is to say UT−⅔ UT);
  the bridging loop P2 is at the potential UT/2 (that is to say UT−³⁄₆ UT);
  the bridging loop B1 is at the potential UT/3 (that is to say UT−⅘ UT);
  the bridging loop P3 is at the potential UT/6 (that is to say UT−⅚ UT);
  the terminal T1 is therefore at zero potential.

Unlike the previous embodiments, the terminal T2 is not adjacent to the cable C1 toward the center of the winding. The voltage U5 develops between the terminal T2 and the cable C6. The voltage denoted U6 in FIG. 6 is the one that occurs between the cable C6 and the cable C1 in the area located at one turn of the spiral of the terminal T1.

Among the voltages U1, U2, U3, U4, U5, V1, V2, V3, V4, V5, the maximum value is UT/3. The voltage U6 also has a maximum value close to UT/3 (since it occurs between the cable C6 at the potential 2·UT/3 and the cable C1 at the potential UT/3 minus the voltage drop caused by one turn of the spiral).

In this fifth embodiment, the highest voltage that develops within the current limiter L5 is the voltage V6 that occurs at the center of the spiral, between the bridging loop P3 and the cable C6. This voltage is close to 2·UT/3. The potential of the cable C6 at this location is specifically close to 5·UT/6 (since this location is at one turn of the spiral of the bridging loop P1), whereas the bridging loop P3 is at the potential UT/6.

The layer of insulator H1 is therefore in this case dimensioned to withstand the voltage of V6. In the present illustrated example, all of the layers of insulator are of the same thickness. The thicknesses of the layers E1 to E5 are therefore aligned with that of H1.

As a variant, as in the first and second embodiment, the layer of insulator H1 may have a thickness greater than the others, and it will then be dimensioned to withstand a voltage of 2·UT/3, whereas the thickness of the other layers of insulator E1 to E5 will in this case be smaller, dimensioned to withstand a voltage of UT/3. According to one example of this variant, the thickness of the layer of insulator H1 may be twice the thickness of the other layers of insulator E1 to E5.

FIG. 7 relates to a sixth embodiment, which is a variant of the fifth embodiment. This variant targets a different arrangement of the bridging loops P1, P2, P3, B1, B2 that modifies the path of the conductor F6 and therefore the distribution of the voltages within the current limiter L6.

According to this sixth embodiment:
  the cables C3 and C6 are connected respectively, at the periphery of the spiral, to the connection terminals T1 and T2;
  the two connection terminals T1, T2 are arranged in this case on either side of the cables C4 and C5 with their three relative layers of insulator E3, E4, E5.

At the periphery of the spiral, the bridging loop B1 connects the cable C1 and the cable C2, and the bridging loop B2 connects the cable C4 and the cable C5.

At the center of the spiral:
  the cables C5 and C6 are connected by a bridging loop P1, forming the first pair of superconducting cables;
  the cables C1 and C4 are connected by a bridging loop P2, forming the second pair of superconducting cables;
  the cables C2 and C3 are connected by a bridging loop P3, forming the third pair of superconducting cables.

The bridging loops P2 and P3 are concentric and are arranged side by side with the bridging loop P1.

The distribution of the potentials is then as follows:
  the terminal T2 is at the potential UT;

the bridging loop P1 is at the potential 5·UT/6 (that is to say UT–⅙ UT);
the bridging loop B2 is at the potential 2·UT/3 (that is to say UT–⅔ UT);
the bridging loop P2 is at the potential UT/2 (that is to say UT–³⁄₆ UT);
the bridging loop B1 is at the potential UT/3 (that is to say UT–⁴⁄₆ UT);
the bridging loop P3 is at the potential UT/6 (that is to say UT–⅚ UT);
the terminal T1 is therefore at zero potential.

According to this sixth embodiment, the terminal T2 is adjacent to the cable C1.

The distribution of the voltages denoted in FIG. 7 is as follows:
from among U5 and V5, the maximum value is UT/3;
from among U4 and V4, the maximum value is UT/3;
from among U3 and V3, the maximum value is 2·UT/3;
from among U2 and V2, the maximum value is UT/3;
from among U1 and V1, the maximum value is UT/3;
U6 has a value slightly less than 2·UT/3 (it has the value 2·UT/3 minus the voltage drop of one turn of the spiral).

In this sixth embodiment, the highest voltage that develops within the current limiter L6 is the voltage U3 that occurs between the bridging loop B2 and the terminal T1, and which has the value 2·UT/3.

The layer of insulator E3 is therefore in this case dimensioned to withstand the voltage of U3. In the present illustrated example, all of the layers of insulator are of the same thickness. The thicknesses of the layers E1, E2, E4, E5, H1 are therefore aligned with that of E3.

As a variant, as in the first and second embodiment, the layers of insulator E3 and H1 may have a thickness greater than the others, and they will then be dimensioned to withstand a voltage of 2·UT/3, whereas the thickness of the other layers of insulator E1, E2, E4, E5 will in this case be smaller.

FIG. 8 relates to a seventh embodiment, which is a variant of the sixth embodiment. This variant targets a different arrangement of the bridging loops P1, P2, P3 at the center of the spiral. The path of the conductor F7 is however not changed, and the distribution of the voltages within the current limiter L7 is therefore the same as for the sixth embodiment.

According to this seventh embodiment, the bridging loops P1 and P3 are diametrically opposite, whereas the bridging loop P2 connects the cable C1 to the cable C4 by diametrically crossing the center of the spiral, the other two bridging loops P1, P3 being located on either side of said spiral.

Since the distribution of the potentials and of the voltages is the same as for the sixth embodiment, the highest voltage that develops within the current limiter L7 is therefore the voltage U3 that occurs between the bridging loop B2 and the terminal T1, and which has the value 2·UT/3.

The layers of insulator are dimensioned in the same way as for the sixth embodiment, with, as a variant, layers of insulator of different thicknesses, in particular with thicknesses E3 and H1 greater than the others.

The arrangement of the bridging loops P1, P2, P3 at the center of the spiral allows additional connection possibilities.

Figure 9:
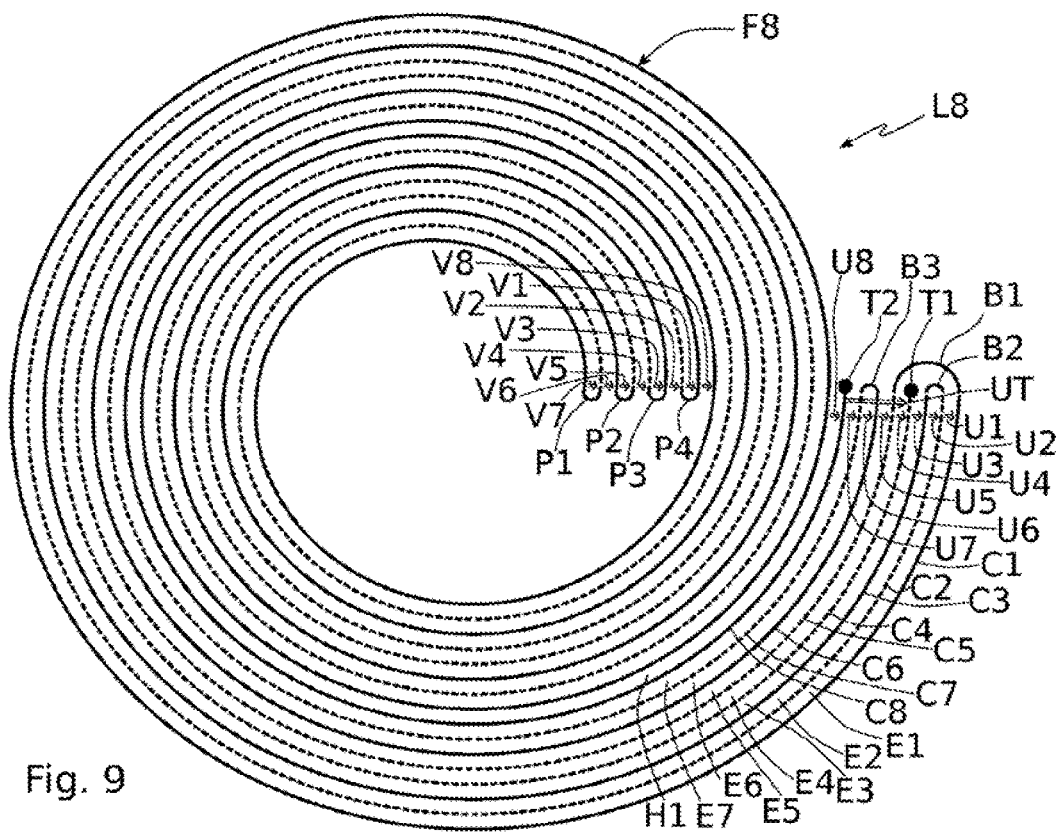
FIG. 9 is a schematic view of a current limiter according to an eighth embodiment of the invention.

FIG. 9 relates to an eighth embodiment in which a current limiter L8 comprises a superconducting conductor F8 that consists in this case of 8 superconducting cables C1 to C8 that are wound with eight layers of insulator E1 to E7 and H1.

According to this eighth embodiment
the cables C4 and C8 are connected respectively, at the periphery of the spiral, to the connection terminals T1 and T2;
the two connection terminals T1, T2 are arranged in this case on either side of the cables C5 and C7 with their four relative layers of insulator E4 to E7.

At the periphery of the spiral, the bridging loop B1 connects the cable C1 and the cable C5, the bridging loop B2 connects the cable C2 and the cable C3 and the bridging loop B3 connects the cable C6 and the cable C7.

At the center of the spiral:
the cables C7 and C8 are connected by a bridging loop P1, forming the first pair of superconducting cables;
the cables C5 and C6 are connected by a bridging loop P2, forming the second pair of superconducting cables;
the cables C3 and C4 are connected by a bridging loop P3, forming the third pair of superconducting cables;
the cables C1 and C2 are connected by a bridging loop P4, forming the fourth pair of superconducting cables.

The bridging loops P1, P2, P3 and P4 are in this case adjacent and are arranged side by side.

Considering that each cable C1 to C8 provides a voltage drop of UT/8, when a voltage UT occurs across the terminals of the current limiter L8 that has become resistive:
the terminal T2 is therefore at the potential UT;
the bridging loop P1 is at the potential 7·UT/8 (that is to say UT–⅛ UT);
the bridging loop B3 is at the potential 3·UT/4 (that is to say UT–²⁄₈ UT);
the bridging loop P2 is at the potential 5·UT/8 (that is to say UT–⅜ UT);
the bridging loop B1 is at the potential UT/2 (that is to say UT–⁴⁄₈ UT);
the bridging loop P4 is at the potential 3·UT/8 (that is to say UT–⅝ UT);
the bridging loop B2 is at the potential UT/4 (that is to say UT–⁶⁄₈ UT);
the bridging loop P3 is at the potential UT/8 (that is to say UT–⅞ UT);
the terminal T1 is therefore at zero potential.

The maximum voltages that therefore have to be withstood by one of the insulating layers E1 to E7 or H1 are therefore:
the voltage U4 that occurs between the cable C5, at the bridging loop B1, and the terminal T1, and which has a value of at most UT/2;
the voltage V4 that occurs at the center of the spiral, between the bridging loops P2 and P3, and which has a value of UT/2;
the voltage U8 that occurs at the periphery of the spiral, between the terminal T2 and the cable C1, and which has a value of at most UT/2 minus the voltage drop of one turn of the spiral at the periphery;
the voltage V8 that occurs at the center of the spiral, between the bridging loop P4 and the cable C8, and which has a value of at most UT/2 minus the voltage drop of one turn of the spiral at the center.

The arrangement of the bridging loops P1 to P4, B1 to B3 makes it possible for only the layer of insulator E4 to have to provide the voltage withstand for the voltages U4 and V4. Said layer of insulator E4 therefore has to be dimensioned to withstand the voltage of UT/2. Each of the other layers of insulator E1 to E3, E5 to E7 for its part has to withstand a voltage equivalent to UT/4, except for H1, which may be dimensioned the same as E4.

In the present illustrated example, all of the layers of insulator are of the same thickness. The thicknesses of the layers E1 to E3, E5 to E7 are therefore aligned with that of E4 and H1.

As a variant, as in the first and second embodiment, the layers of insulator E4 and H1 may have a thickness greater than the others, for example twice the thickness.

Figure 10:
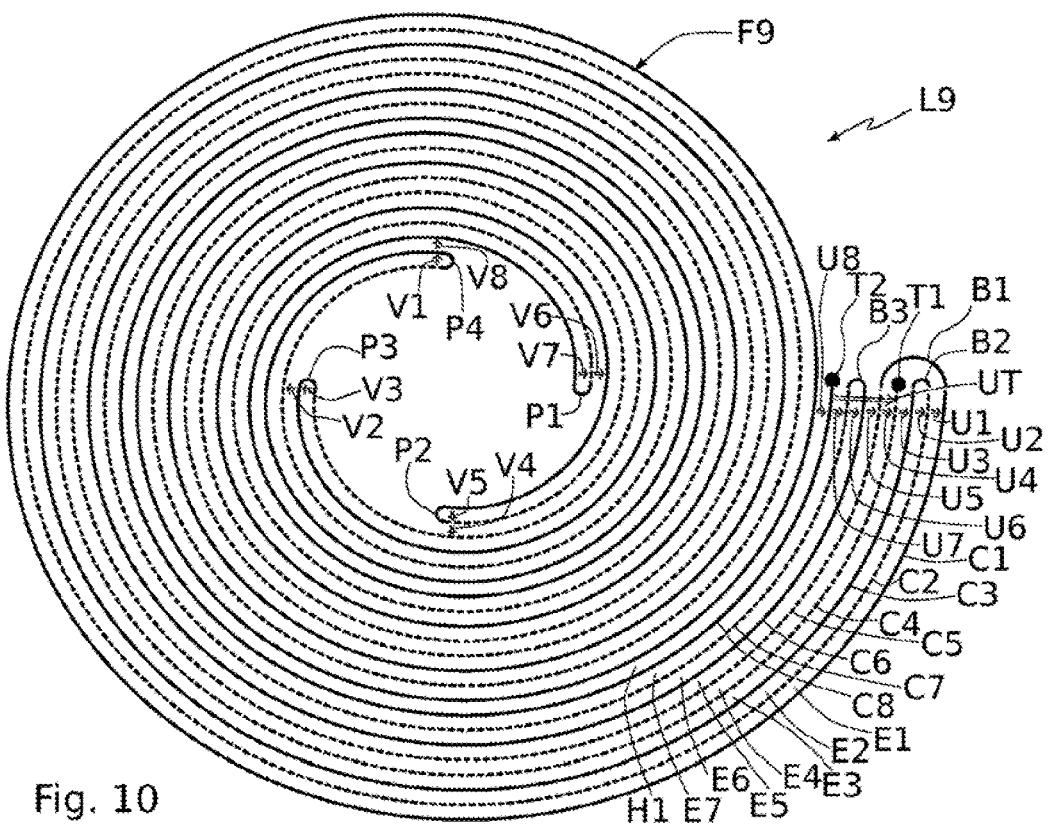
FIG. 10 is a schematic view of a current limiter according to a ninth embodiment of the invention.

FIG. 10 relates to a ninth embodiment, which is a variant of the eighth embodiment. The current limiter L9 in this case comprises a superconducting conductor F9, which consists in this case of 8 superconducting cables C1 to C7 wound with eight layers of insulator E1 to E7 and H1. According to this variant, the bridging loops P1, P2, P3 and P4 are distributed regularly over the center of the spiral. The bridging loops P1 and P3 are diametrically opposite, as are the bridging loops P2 and P4. The bridging loops P1, P2, P3, P4 are in this case adjacent but are not arranged side by side, and they are distributed regularly over the inner contour of the coil.

The other features of this ninth embodiment are the same as for the eighth embodiment.

Figure 11:
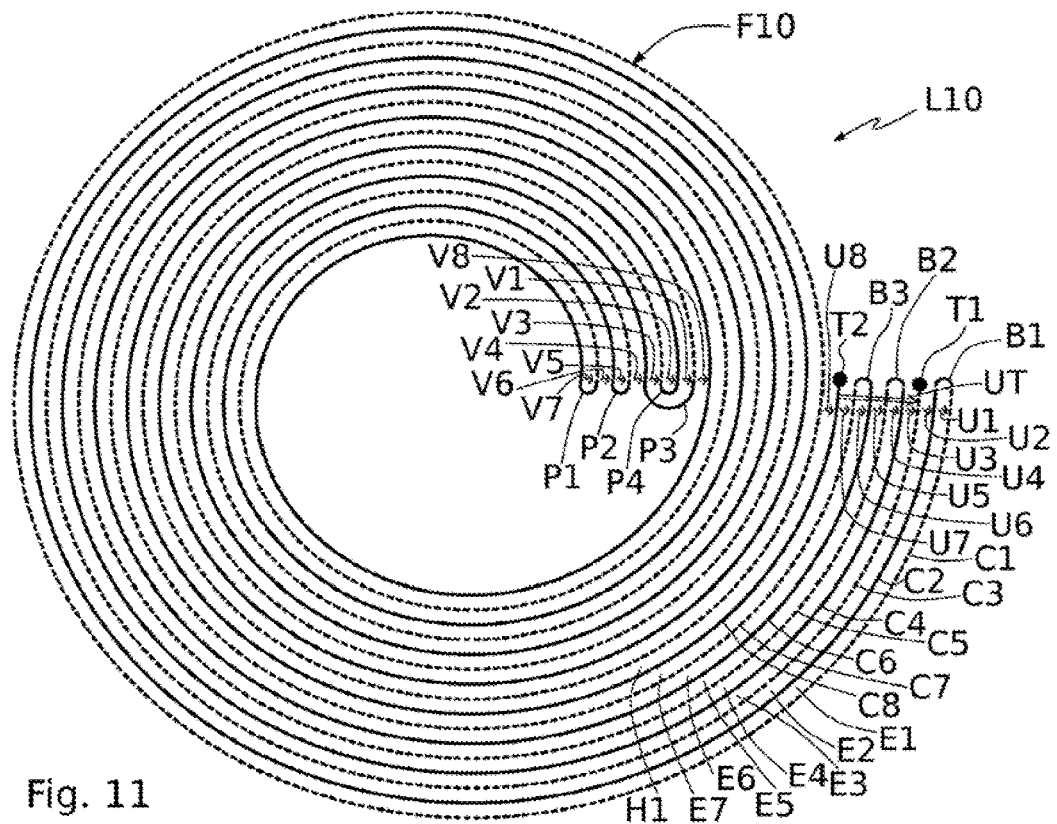
FIG. 11 is a schematic view of a current limiter according to a tenth embodiment of the invention.

FIG. 11 relates to a tenth embodiment in which a current limiter L10 comprises a superconducting conductor F0 that consists in this case of 8 superconducting cables C1 to C8 that are wound with eight layers of insulator E1 to E7 and H1.

According to this tenth embodiment:
the cables C3 and C8 are connected respectively, at the periphery of the spiral, to the connection terminals T1 and T2;
the two connection terminals T1, T2 are arranged in this case on either side of the cables C4 and C7 with their five relative layers of insulator E3 to E7.

At the periphery of the spiral, the bridging loop B1 connects the cable C1 and the cable C2, the bridging loop B2 connects the cable C4 and the cable C5 and the bridging loop B3 connects the cable C6 and the cable C7.

At the center of the spiral:
the cables C7 and C8 are connected by a bridging loop P1, forming the first pair of superconducting cables;
the cables C5 and C6 are connected by a bridging loop P2, forming the second pair of superconducting cables;
the cables C4 and C1 are connected by a bridging loop P3, forming the third pair of superconducting cables;
the cables C2 and C3 are connected by a bridging loop P4, forming the fourth pair of superconducting cables.

The bridging loops P1 and P2 are in this case adjacent and arranged side by side, whereas the bridging loops P3 and P4 are concentric.

The distribution of the potentials is then as follows:
the terminal T2 is therefore at the potential UT;
the bridging loop P1 is at the potential 7·UT/8 (that is to say UT−⅛ UT);
the bridging loop B3 is at the potential 3·UT/4 (that is to say UT−²⁄₈ UT);
the bridging loop P2 is at the potential 5·UT/8 (that is to say UT−⅜ UT);
the bridging loop B2 is at the potential UT/2 (that is to say UT−⁴⁄₈ UT);
the bridging loop P3 is at the potential 3·UT/8 (that is to say UT−⅝ UT);
the bridging loop B1 is at the potential UT/4 (that is to say UT−⁶⁄₈ UT);
the bridging loop P4 is at the potential UT/8 (that is to say UT−⅞ UT);
the terminal T1 is therefore at zero potential.

According to this tenth embodiment, the terminal T2 is adjacent to the cable C1.

The distribution of the voltages denoted in FIG. 11 (at the periphery of the spiral) is therefore as follows:
U7 has the value UT/4;
U6 has the value zero;
U5 has the value UT/4;
U4 has the value zero;
U3 has the value UT/2;
U2 has the value UT/4;
U1 has the value zero;
U8 has a value slightly greater than 3·UT/4 (U8 has the value 3·UT/4 plus the voltage drop of one turn of the spiral).

At the center of the spiral, from among the voltages V1 to V7, the maximum value is UT/4, and the voltage V8 is close to UT/2.

In this tenth embodiment, the highest voltage that develops within the current limiter L10 is the voltage U8 that occurs between the terminal T2 and the adjacent cable C1, and has a value slightly greater than 3·UT/4.

The layer of insulator H1 is therefore in this case dimensioned to withstand the voltage of U8. In the present illustrated example, all of the layers of insulator are of the same thickness. The thicknesses of the layers E1 to E7 are therefore aligned with that of H1.

As a variant, as in the first and second embodiment, the layer of insulator H1 may have a thickness greater than the others, and it will then be dimensioned to withstand a voltage greater than 3·UT/4, whereas the thickness of the other layers of insulator will in this case be smaller.

As a variant, each layer of insulator has its own thickness that is adapted to the voltage that it has to withstand. Thus, according to this variant:
E7, E6, E5, E4, E2 and E1 have a thickness dimensioned to withstand the voltage of UT/4, since all these layers of insulator will have to withstand a voltage of the order of U/4, either at the periphery or at the center of the coil;
E3 has a thickness twice that of E7;
H1 has the greatest thickness, dimensioned to withstand a voltage slightly greater than 3·UT/4.

Figure 12:
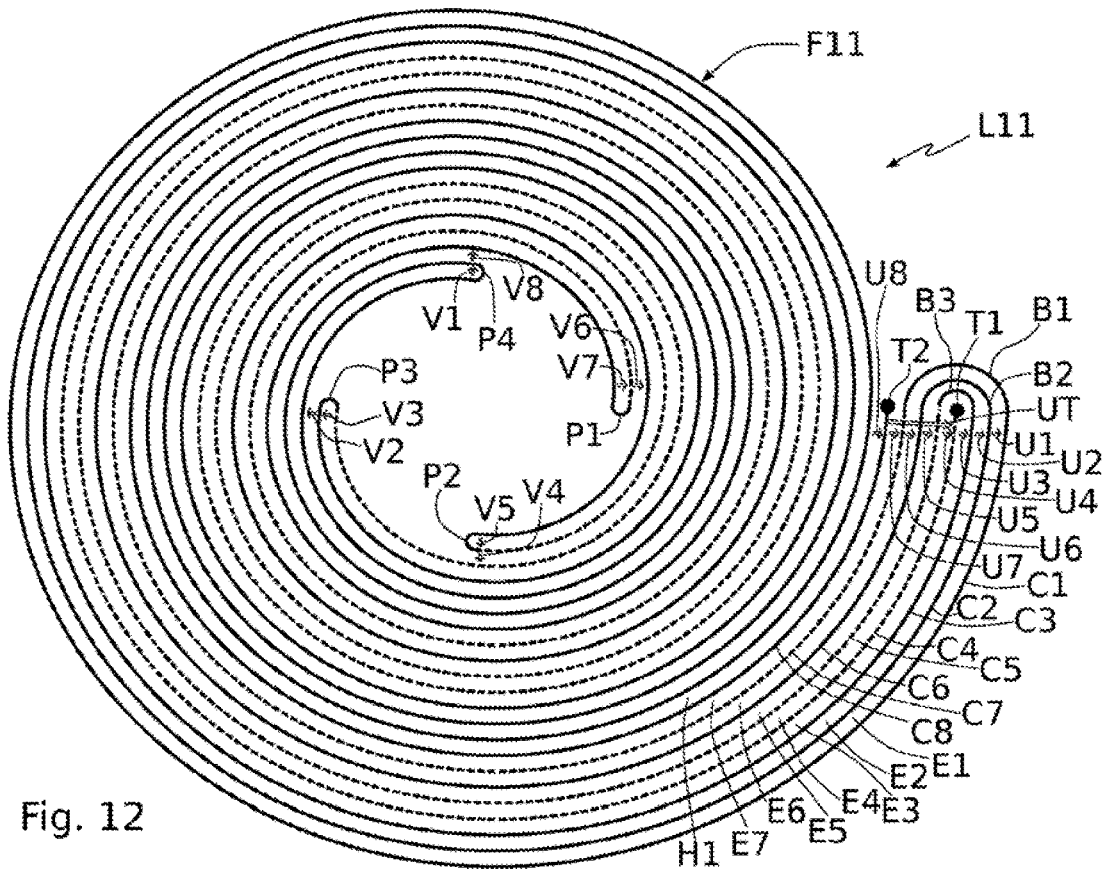
FIG. 12 is a schematic view of a current limiter according to an eleventh embodiment of the invention.

FIG. 12 shows an eleventh embodiment in which a current limiter L11 comprises a superconducting conductor F11 that is a variant of the ninth embodiment. The bridging loops P1, P2, P3, P4 at the center of the spiral are identical to the corresponding bridging loops of the ninth embodiment, as are the cables C4 and C8, which are connected respectively, at the periphery of the spiral, to the connection terminals T1 and T2.

According to this variant, at the periphery of the spiral, the bridging loop B1 connects the cable C1 and the cable C7, the bridging loop B2 connects the cable C2 and the cable C6 and the bridging loop B3 connects the cable C3 and the cable C5. The bridging loops B1, B2 and B3 are concentric.

The distribution of the potentials is then as follows:
the terminal T2 is at the potential UT;
the bridging loop P1 is at the potential 7·UT/8 (that is to say UT−⅛ UT);
the bridging loop B1 is at the potential 3·UT/4 (that is to say UT−²⁄₈ UT);
the bridging loop P4 is at the potential 5·UT/8 (that is to say UT−⅜ UT);
the bridging loop B2 is at the potential UT/2 (that is to say UT−⁴⁄₈ UT);
the bridging loop P2 is at the potential 3·UT/8 (that is to say UT−⅝ UT);

the bridging loop B3 is at the potential UT/4 (that is to say UT-⅝ UT);

the bridging loop P3 is at the potential UT/8 (that is to say UT-⅞ UT);

the terminal T1 is therefore at zero potential.

According to this eleventh embodiment, the terminal T2 is adjacent to the cable C1.

The distribution of the voltages denoted in FIG. 12 is therefore as follows:

U1 to U7 have the value UT/4;
U8 has a value slightly less than UT/4;
V2 and V6 have the value UT/2;
V4 and V8 have the value UT/4.

In this eleventh embodiment, the highest voltages that develop within the current limiter L11 are the voltages V2 and V6 that occur at the center of the spiral, respectively between the bridging loop P3 and the adjacent cable C2, and between the bridging loop P1 and the cable C6, and have a value slightly greater than UT/2.

The layers of insulator E2 and E6 are therefore in this case dimensioned to withstand the voltages V2 and V6. In the present illustrated example, all of the layers of insulator are of the same thickness. The thicknesses of the layers E1, E3, E4, E5, E7, H1 are therefore aligned with that of E2 and E6.

As a variant, as in the first and second embodiment, the layers of insulator E2 and E6 may be the only ones to be of a thickness greater than the others, and they will then be dimensioned to withstand a voltage slightly greater than UT/2, whereas the thickness of the other layers of insulator will in this case be smaller.

Figure 13:
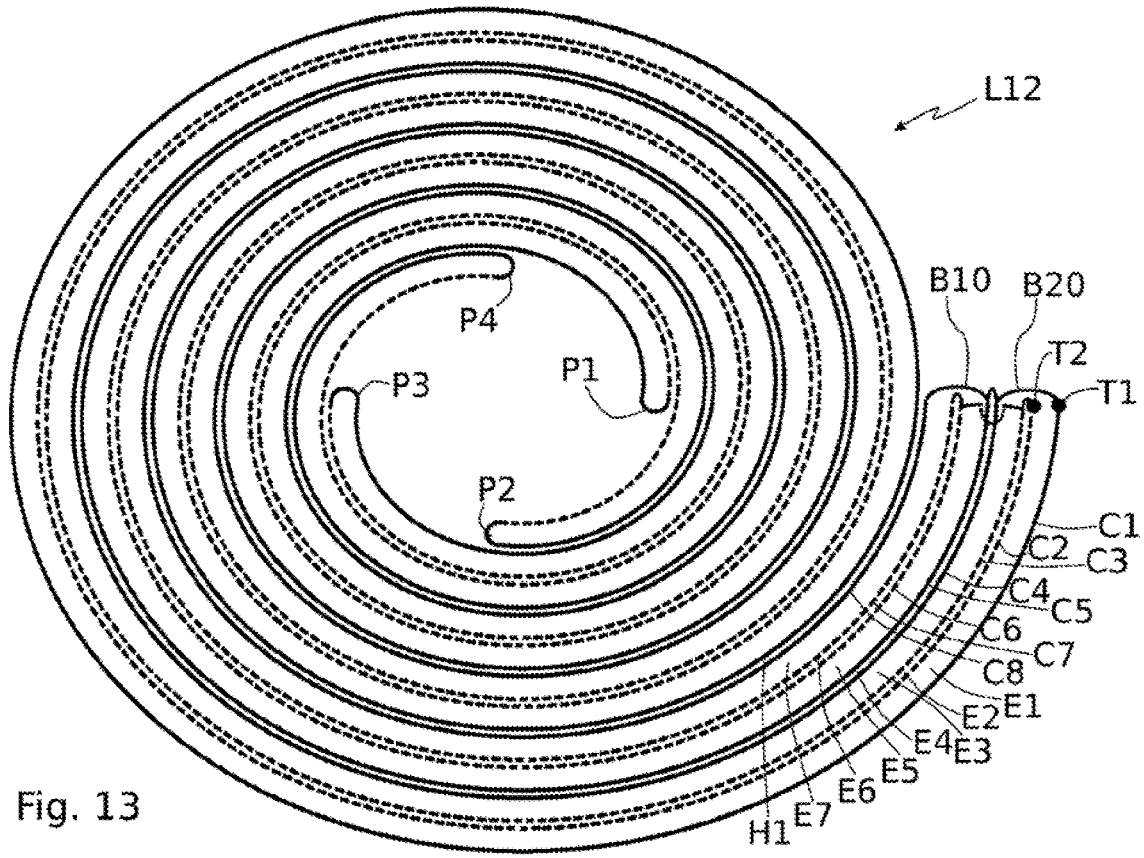
FIG. 13 is a schematic view of a current limiter according to a twelfth embodiment of the invention.

FIG. 13 illustrates a twelfth embodiment according to which the current limiter L12 comprises 8 superconducting cables. The cables C1, C4, C5 and C8 are connected to one another, at the periphery of the coil, by three bridging loops B10 that are also connected to the connection terminal T1. The cables C2, C3, C6 and C7 are also connected to one another, at the periphery of the coil, by three bridging loops B20 that are also connected to the connection terminal T2.

At the center of the coil:
the cables C1 and C2 are connected by a bridging loop P4;
the cables C3 and C4 are connected by a bridging loop P3;
the cables C5 and C6 are connected by a bridging loop P2;
the cables C7 and C8 are connected by a bridging loop P1.

The layers of insulator E1, E3, E5 and E7 have the same thickness dimensioned to withstand the voltage of the maximum voltage occurring between T1 and T2.

The layers of insulator E2, E4, E6 and H1 have the same thickness, which is much less than the thickness of the layers of insulator E1, E3, E5 and E7.

Figure 14:
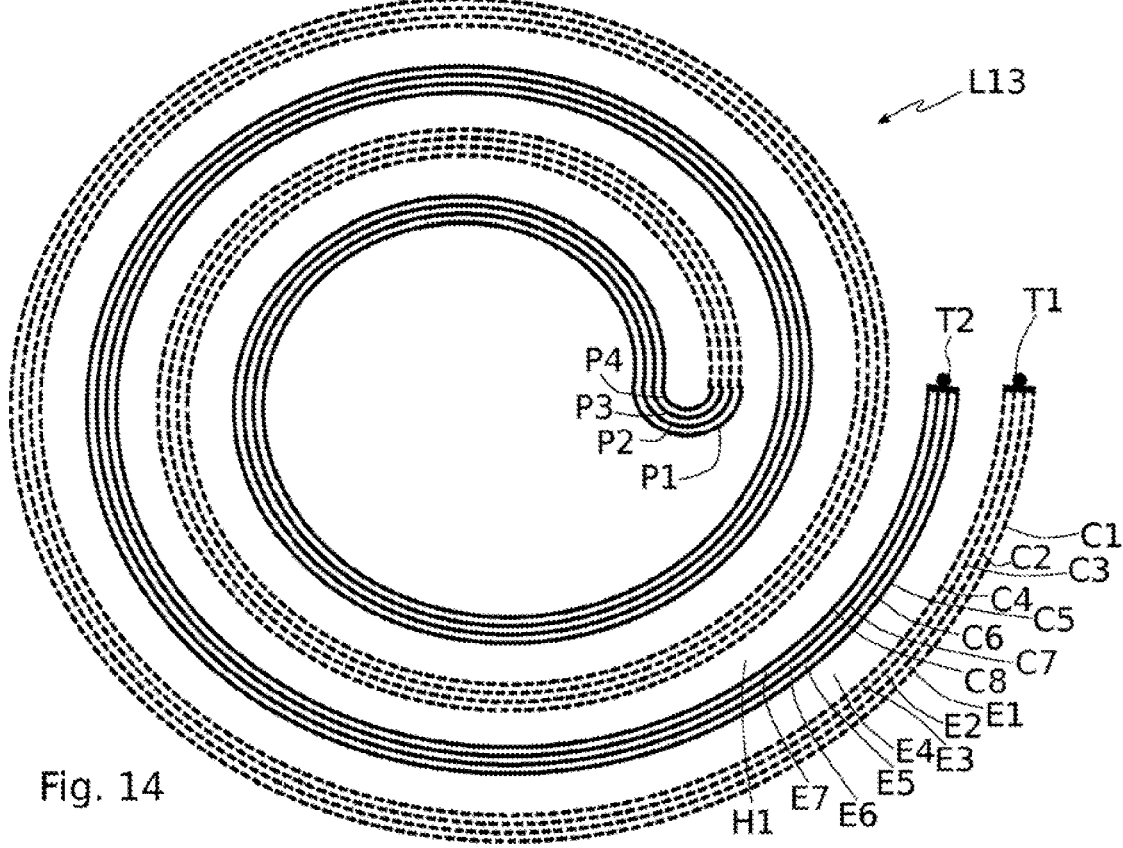
FIG. 14 is a schematic view of a current limiter according to a thirteenth embodiment of the invention.

FIG. 14 illustrates a thirteenth embodiment according to which the current limiter L13 comprises 8 superconducting cables. The cables C1, C2, C3 and C4 are connected to one another, at the periphery of the coil, directly by the connection terminal T1. The cables C5, C6, C7 and C8 are also connected to one another, at the periphery of the coil, directly by the connection terminal T2.

At the center of the coil:
the cables C1 and C8 are connected by a bridging loop P1;
the cables C2 and C7 are connected by a bridging loop P2;
the cables C3 and C6 are connected by a bridging loop P3;
the cables C4 and C5 are connected by a bridging loop P4.

The layers of insulator E4 and H1 have the same thickness dimensioned to withstand the voltage of the maximum voltage occurring between T1 and T2.

The layers of insulator E1, E2, E3, E5, E6 and E7 have the same thickness, which is much less than the thickness of the layers of insulator E4 and H1.

Figure 15:
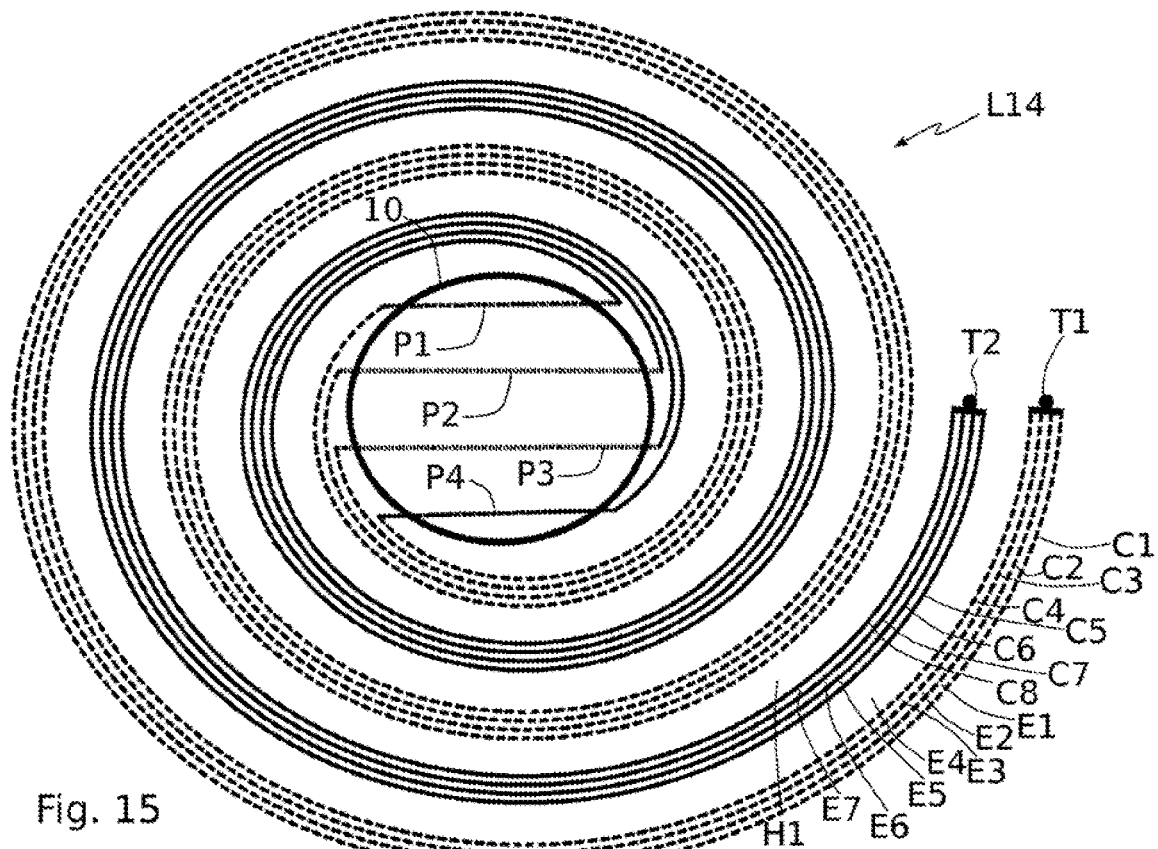
FIG. 15 is a schematic view of a current limiter according to a variant of the embodiment of FIG. 14.

FIG. 15 illustrates a variant of the embodiment of FIG. 14. According to this variant, the current limiter L14 comprises, at its center, a connection disk 10 bearing the four connecting loops P1, P2, P3, P4.

The connections at the center of the coil are the same as in FIG. 14:
the cables C1 and C8 are connected by the bridging loop P1;
the cables C2 and C7 are connected by the bridging loop P2;
the cables C3 and C6 are connected by the bridging loop P3;
the cables C4 and C5 are connected by the bridging loop P4.

However, the connecting loops pass through the disk 10 that bears them and facilitates assembly and the connections at the center of the coil. The other features are identical to those of FIG. 14.

Figure 16:
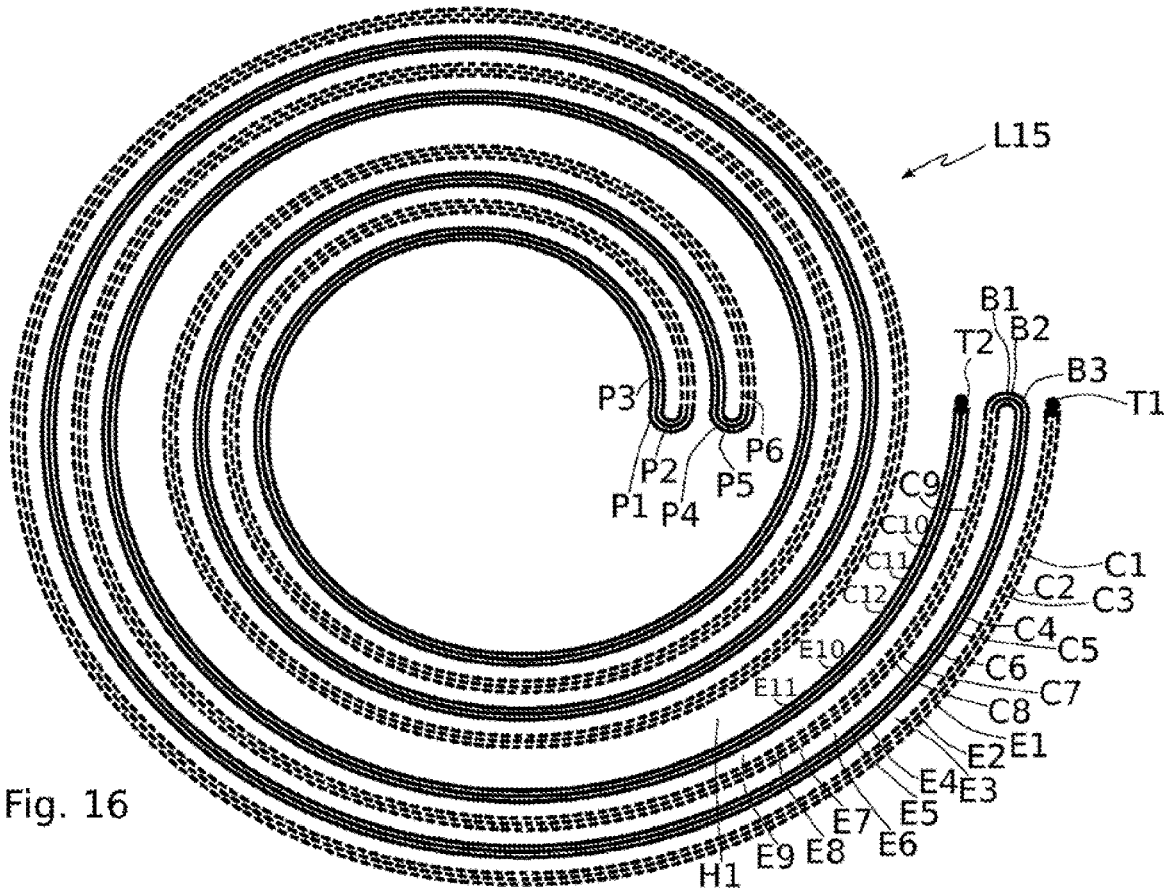
FIG. 16 is a schematic view of a current limiter according to a fifteenth embodiment of the invention.

FIG. 16 illustrates a fifteenth embodiment according to which the current limiter L15 comprises 12 cables.

At the periphery:
the cables C1, C2 and C3 are connected to terminal T1.
the cables C10, C11 and C12 are connected to terminal T2.
the cables C4 and C9 are connected to the bridging loop B1,
the cables C5 and C8 are connected to the bridging loop B2,
the cables C6 and C7 are connected to the bridging loop B3.

At the center of the coil:
the cables C1 and C6 are connected to the bridging loop P4,
the cables C2 and C5 are connected to the bridging loop P5,
the cables C3 and C4 are connected to the bridging loop P6,
the cables C7 and C12 are connected to the bridging loop P1,
the cables C8 and C11 are connected to the bridging loop P2,
the cables C9 and C10 are connected to the bridging loop P3.

The layers of insulator E1, E2, E4, E5, E7, E8, E10 and E11 have the same thickness, which may be reduced to a minimum.

The layers of insulator E3, E6, E9 and H1 may be dimensioned in a manner similar to the case in FIG. 2.

In conclusion, in all of the embodiments described above, the arrangement of the bridging loops and/or the thicknesses of insulating layers is adapted in order to increase voltage withstand and/or to make the current limiter more compact.

Other variant embodiments of the current limiter may be implemented without departing from the scope of the invention. For example, each superconducting conductor may be formed of a single conductor, or may be formed of several superconducting cables placed in parallel with one another (which leads to a simple increase in the cross section of the conductor). The bridging loops may for their part be produced in various ways: conductor folded back on itself, component provided with a connection terminal block and intermediate conductive tracks, mechanical fastening devices, or the like. The electrical resistance of the bridging loops is preferably low, for example, similar to that of copper.

Furthermore, the current limiter may have any number of turns of the spiral, significantly higher than the small number of turns in the schematic examples described here in order to explain the principle. The expression "spiral windings" should moreover be understood in the broad sense, that is to say that the superconducting conductor is wound in layers by successive rotations, the cross section being able to be for example square or any other shape.

In the schematic view of FIGS. 4, 5, 6, 9, 10, 12 and 13, one or more bridging loops surround a connection terminal, it being understood that a person skilled in the art will know how to create such connections on the real device, for example by passing the terminal in question through a plane perpendicular to the plane of the drawing, in order to free it from the bridging loops and to create the terminal connections.

In the described examples, the center of the coil forms a first connection area provided with bridging loops and the periphery of the coil forms a second connection area provided with bridging loops, such that two superconducting cables are electrically connected to one another in the first connection area and, in the second connection area, one of the superconducting cables of one pair is electrically connected to one of the superconducting cables of another pair, the other superconducting cable of each pair being connected to an electrical connection terminal or to an additional pair. However, as a variant, the first connection area may be located at the periphery of the coil, and the second connection area may be located at the center of the coil, the bridging loops being then reversed, and the connection terminals are then located at the center of the coil.

Furthermore, in all of the diagrams except for FIG. 28, for reasons of simplicity, the connection terminals T1 and T2 have been shown side by side. However, the connection terminals may also be offset angularly (for example by a quarter turn) if their connection to a circuit is thereby facilitated.

The invention claimed is:

1. A superconducting current limiting dipole (L1 to L15), two terminals of which are formed by a first electrical connection terminal (T1) and a second electrical connection terminal (T2), the current limiting dipole comprising:
   a superconducting conductor (F1 to F15) wound so as to form a two-wire coil extending in a single plane,
   a layer of insulator (E1 to E11, H1) being arranged between two turns of said coil,
   said superconducting conductor (F1 to F15) comprises at least four separate superconducting cables (C1 to C12) wound in parallel and arranged in at least two pairs, each of the pairs being formed of two of said superconducting cables (C1 to C12), the superconducting cables (C1 to C12) being connected to one another so that the superconducting conductor extends in at least two outward and return paths between a periphery and a center of the coil while connecting the first electrical connection terminal (T1) to the second electrical connection terminal (T2).

2. The current limiting dipole as claimed in claim 1, wherein each of the pairs is formed of a first and a second superconducting cable (C1 to C12) that are electrically connected to one another in a first connection area and in that, in a second connection area, the first superconducting cable of each pair is electrically connected to one of the superconducting cables of another pair, the second superconducting cable of each pair being connected to an electrical connection terminal (T1, T2) or to one of the superconducting cables of another pair, one of the connection areas being the center of the coil and the other of the connection areas being the periphery of the coil.

3. The current limiting dipole as claimed in claim 2, wherein the first connection area is located at the center of the coil, and in that the second connection area is located at the periphery of the coil.

4. The current limiting dipole as claimed in claim 2, wherein the first connection area is located at the periphery of the coil, and in that the second connection area is located at the center of the coil.

5. The current limiting dipole as claimed in claim 3 further comprises four superconducting cables (C1 to C4) arranged in two pairs, two bridging loops (P1, P2) in a first connection area, a bridging loop (B1) in a second connection area, and two connection terminals (T1, T2), the first connection area and the second connection area of the coil being chosen from among the periphery and the center of the coil, the bundle layer of insulator (H1) being located between two superconducting cables that are each connected to a connection terminal (T1, T2).

6. The current limiting dipole as claimed in claim 3 further comprises six superconducting cables (C1 to C6) arranged in three pairs, three bridging loops (P1 to P3) in a first connection area, two bridging loops (B1, B2) in a second connection area, and two connection terminals (T1, T2), the first connection area and the second connection area of the coil being chosen from among the periphery and the center of the coil, the bundle layer of insulator (H1) being located between two superconducting cables that are each connected to a connection terminal (T1, T2).

7. The current limiting dipole as claimed in claim 3 further comprises eight superconducting cables (C1 to C8) arranged in four pairs, four bridging loops (P1 to P4) in a first connection area, three bridging loops (B1 to B3) in a second connection area, and two connection terminals (T1, T2), the first connection area and the second connection area of the coil being chosen from among the periphery and the center of the coil, the bundle layer of insulator (H1) being located between two superconducting cables that are each connected to a connection terminal (T1, T2).

8. The current limiting dipole as claimed in claim 1, wherein the superconducting cables (C1 to C12) are connected to one another at the center of the coil, so as to form said pairs, by bridging loops (P1 to P6).

9. The current limiting dipole as claimed in claim 8, wherein-said bridging loops (P1 to P6) are arranged side by side.

10. The current limiting dipole as claimed in claim 8, wherein said bridging loops (P1 to P6) are distributed over an inner contour of the coil.

11. The current limiting dipole as claimed in claim 1, wherein the superconducting conductor comprises of 2N superconducting cables arranged in N pairs, N bridging loops in a first connection area of the coil and N−1 bridging loops in a second connection area of the coil, the first connection area and the second connection area of the coil being chosen from among the periphery and the center of the coil, N being greater than or equal to 2.

12. The current limiting dipole as claimed in claim 11, wherein the superconducting conductor comprises N bridging loops at the periphery of the coil, respectively at the center of the coil, and N−1 bridging loops at the center of the coil, respectively at the periphery of the coil.

13. The current limiting dipole as claimed in claim 11, wherein the superconducting conductor (F1 to F15) consists of 2N superconducting cables (C1 to C12) arranged in N pairs, N bridging loops (P1 to P6) at the center of the coil and N−1 bridging loops (B1 to B3) at the periphery of the coil.

14. The current limiting dipole as claimed in claim 11, wherein the superconducting conductor consists of 2N superconducting cables arranged in N pairs, N−1 bridging loops at the center of the coil and N bridging loops at the periphery of the coil.

15. The current limiting dipole as claimed in claim 13, wherein the superconducting conductor (F1, F3, F4) consists of four superconducting cables (C1 to C4) arranged in two pairs, two bridging loops (P1, P2) at the center of the coil and one bridging loop (B1) at the periphery of the coil.

16. The current limiting dipole as claimed in claim 15, wherein the two bridging loops (P1, P2) at the center of the coil are adjacent, and in that the bridging loop (B1) at the periphery of the coil is located between the two connection terminals (T1, T2).

17. The current limiting dipole as claimed in claim 16, wherein, within the coil, between the superconducting cable (C4) connected to one connection terminal (T2) and an adjacent superconducting cable (C1) that is connected to the other connection terminal (T1), a layer of insulator (H1) has a thickness greater than other layers of insulator (E1 to E3).

18. The current limiting dipole as claimed in claim 15, wherein the two bridging loops (P1, P2) at the center of the coil are adjacent, and in that the bridging loop (B1) at the periphery of the coil bypasses a connection terminal (T1).

19. The current limiting dipole as claimed in claim 15, wherein the two bridging loops (P1, P2) at the center of the coil are concentric, and in that the bridging loop (B1) at the periphery of the coil bypasses a connection terminal (T1).

20. The current limiting dipole as claimed in claim 13, wherein the superconducting conductor (F5, F6, F7) consists of six superconducting cables (C1 to C6) arranged in three pairs, three bridging loops (P1, P2, P3) at the center of the coil and two bridging loops (B1, B2) at the periphery of the coil.

21. The current limiting dipole as claimed in claim 20, wherein the three bridging loops (P1, P2, P3) at the center of the coil are adjacent and in that the two bridging loops (B1, B2) at the periphery of the coil each bypass a connection terminal (T1, T2).

22. The current limiting dipole as claimed in claim 20, wherein two of the bridging loops (P2, P3) at the center of the coil are concentric and in that one of the bridging loops (B2) at the periphery of the coil is arranged between the two connection terminals (T1, T2).

23. The current limiting dipole as claimed in claim 20, wherein one of the bridging loops (P2) at the center of the coil diametrically passes through the center of the coil, the other two bridging loops (P1, P3) at the center of the coil being located on either side of said coil, and in that one of the bridging loops (B2) at the periphery of the coil is arranged between the two connection terminals (T1, T2).

24. The current limiting dipole as claimed in claim 13, wherein the superconducting conductor (L3; L8 to L11) consists of eight superconducting cables (C1 to C8) arranged in four pairs, four bridging loops (P1 to P4) at the center of the coil and three bridging loops (B1 to B3) at the periphery of the coil.

25. The current limiting dipole as claimed in claim 24, wherein the four bridging loops (P1 to P4) at the center of the coil are adjacent and in that one of the bridging loops (B1) at the periphery of the coil bypasses a connection terminal (T1) and another of the bridging loops (B2), and in that the third bridging loop (B3) at the periphery of the coil is located between the two connection terminals (T1, T2).

26. The current limiting dipole as claimed in claim 24, wherein two of the bridging loops (P1, P2) at the center of the coil are adjacent, the other two bridging loops (P3, P4) at the center of the coil being concentric, and in that two of the bridging loops (B2, B3) at the periphery of the coil are located between the two connection terminals (T1, T2).

27. The current limiting dipole as claimed in claim 24, wherein the four bridging loops (P1 to P4) at the center of the coil are adjacent and in that the three loops (B1 to B3) at the periphery of the coil are concentric and surround a connection terminal (T1, T2).

28. The current limiting dipole as claimed in claim 1, wherein
the superconducting cables (C1 to C12) form a bundle that is wound on itself, one of the layers of insulator (H1) forming a bundle layer of insulator arranged between two windings of the bundle, whereas the other layers of insulator (E1 to E11) form cable layers of insulator that are each arranged between two superconducting cables, the bundle layer of insulator (H1) being located between two superconducting cables that are each connected to one of said connection terminals (T1, T2); and
the current limiter comprises at least two layers of insulator of different thicknesses.

29. The current limiting dipole as claimed in claim 28, further comprises at least two layers of insulator made of a different material.

30. The current limiting dipole as claimed in claim 1, wherein a layer of insulator located between two superconducting cables whose potential difference is the highest, when the current limiting dipole becomes resistive, has a thickness greater than that of other layers of insulator.

31. The current limiting dipole as claimed in claim 28, wherein the bundle layer of insulator (H1) has a thickness greater than the cable layers of insulator (E1 to E11).

32. The current limiting dipole as claimed in claim 28, wherein the bundle layer of insulator (H1) has a thickness greater than ⅔ of the sum of the thicknesses of the cable layers of insulator (E1 to E11).

33. The current limiting dipole as claimed in claim 28, wherein the bundle layer of insulator (H1) has a thickness greater than 1.5 times the thickness of a cable layer of insulator (E1 to E11).

34. The current limiting dipole as claimed in claim 31, wherein, with the cables being in a number of 2n, the bundle layer of insulator (H1) has a thickness of an order of n times the thickness of a cable layer of insulator (E1 to E11).

35. The current limiting dipole as claimed in claim 1, wherein at least one of the superconducting cables is interposed between the two superconducting cables that are each connected to a connection terminal (T1, T2).

36. The current limiting dipole as claimed in claim 1, wherein the two superconducting cables of one and the same pair are of the same length.

37. The current limiting dipole as claimed in claim 1, wherein between the two superconducting cables connected to the connection terminals (T1, T2), a number of layers of insulator is equal to at least half a total number of superconducting cables.

38. The current limiting dipole as claimed in claim 1, wherein a layer of insulator located between two superconducting cables whose potential difference is the lowest, when the current limiting dipole becomes resistive, has a thickness less than that of other layers of insulator.

* * * * *